(12) United States Patent
Baselmans et al.

(10) Patent No.: US 10,620,548 B2
(45) Date of Patent: Apr. 14, 2020

(54) LITHOGRAPHIC METHOD AND APPARATUS

(71) Applicant: ASML Netherlands B.V., Veldhoven (NL)

(72) Inventors: Johannes Jacobus Matheus Baselmans, Oirschot (NL); Pieter Bart Aloïs De Buck, Eindhoven (NL); Nico Vanroose, Borgerhout (BE); Giovanni Imponente, Eindhoven (NL); Roland Johannes Wilhelmus Stas, 's-Hertogenbosch (NL); Chanpreet Kaur, Eindhoven (NL); James Robert Downes, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 38 days.

(21) Appl. No.: 15/567,191

(22) PCT Filed: Apr. 18, 2016

(86) PCT No.: PCT/EP2016/058544
§ 371 (c)(1),
(2) Date: Oct. 17, 2017

(87) PCT Pub. No.: WO2016/169890
PCT Pub. Date: Oct. 27, 2016

(65) Prior Publication Data
US 2018/0088467 A1    Mar. 29, 2018

(30) Foreign Application Priority Data

Apr. 20, 2015 (EP) ...................................... 15164277

(51) Int. Cl.
*G03F 7/20* (2006.01)
*G01M 11/02* (2006.01)

(52) U.S. Cl.
CPC ......... *G03F 7/706* (2013.01); *G01M 11/0242* (2013.01); *G01M 11/0257* (2013.01); *G03F 7/70866* (2013.01)

(58) Field of Classification Search
CPC ....................................................... G03F 7/706
(Continued)

(56) References Cited

U.S. PATENT DOCUMENTS 5,148,036 A * 9/1992 Matsugu ................ B82Y 10/00
250/548
6,342,703 B1 * 1/2002 Koga .................... G03F 9/7092
250/548

(Continued)

FOREIGN PATENT DOCUMENTS

EP        1231514 A1    8/2002
JP     2006-185972 A    7/2006

(Continued)

OTHER PUBLICATIONS

International Search Report directed to related International Patent Application No. PCT/EP2016/058544, dated Aug. 9, 2016; 5 pages.

(Continued)

*Primary Examiner* — Tarifur R Chowdhury
*Assistant Examiner* — Omar H Nixon
(74) *Attorney, Agent, or Firm* — Sterne, Kessler, Goldstein & Fox P.L.L.C.

(57) ABSTRACT

A method comprising illuminating a patterning device (MA') comprising a plurality of patterned regions (15a-15c) of which each patterns a measurement beam (17a-17c), projecting, with a projection system (PL), the measurement beams onto a sensor apparatus (21) comprising a plurality of detector regions (25a-25c), making a first measurement of radiation when the patterning device and the sensor apparatus are positioned in a first relative configuration, moving (Continued)

at least one of the patterning device and the sensor apparatus so as to change the relative configuration of the patterning device to a second relative configuration, making a second measurement of radiation when the patterning device and the sensor apparatus are positioned in the second relative configuration in which at least some of the plurality of detector regions receive a different measurement beam to the measurement beam which was received at the respective detector region in the first relative configuration and determining aberrations caused by the projection system.

16 Claims, 11 Drawing Sheets

(58) Field of Classification Search
USPC .......................................................... 356/391
See application file for complete search history.

(56) References Cited

U.S. PATENT DOCUMENTS

| | | | |
|---|---|---|---|
| 6,879,390 B1* | 4/2005 | Kvamme | G01N 21/8806 356/237.2 |
| 8,692,974 B2 | 4/2014 | Baselmans | |
| 2002/0145717 A1 | 10/2002 | Baselmans et al. | |
| 2002/0159048 A1 | 10/2002 | Inoue et al. | |
| 2003/0086078 A1* | 5/2003 | Nakauchi | G01M 11/0264 356/124.5 |
| 2005/0200940 A1 | 9/2005 | Emer | |
| 2006/0044536 A1* | 3/2006 | Ohsaki | G03F 7/706 355/52 |
| 2006/0061757 A1 | 3/2006 | Yamamoto et al. | |
| 2008/0186509 A1* | 8/2008 | Kato | B82Y 10/00 356/521 |
| 2009/0195764 A1* | 8/2009 | Takenaka | G03F 7/706 355/53 |
| 2009/0213389 A1 | 8/2009 | Ouchi et al. | |
| 2009/0251702 A1 | 10/2009 | Murphy et al. | |
| 2009/0273843 A1* | 11/2009 | Raskar | G02B 27/0018 359/601 |
| 2010/0110403 A1* | 5/2010 | Ogasawara | G01M 11/0264 355/55 |
| 2010/0177323 A1 | 7/2010 | Ouchi | |
| 2011/0053060 A1* | 3/2011 | Tsubata | G03B 27/42 430/30 |
| 2011/0222032 A1 | 9/2011 | Ten Kate et al. | |
| 2013/0235361 A1 | 9/2013 | Baselmans et al. | |

FOREIGN PATENT DOCUMENTS

| | | |
|---|---|---|
| JP | 2009-009127 A | 1/2009 |
| TW | 201502719 A | 1/2015 |
| WO | WO 2014/127985 A1 | 8/2014 |

OTHER PUBLICATIONS

International Preliminary Report on Patentability and Written Opinion of the International Searching Authority directed to related International Patent Application No. PCT/EP2016/058544, dated Oct. 24, 2017; 9 pages.

Van De Kerkhof et al., "Full optical column characterization of DUV lithographic projection tools," Optical Microlithography XVII, vol. 5377, May 2004; 11 pages.

* cited by examiner

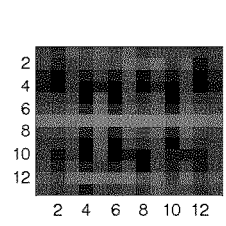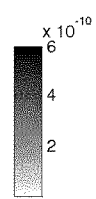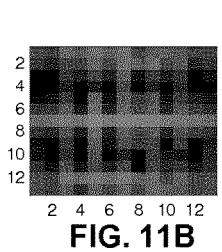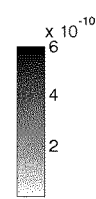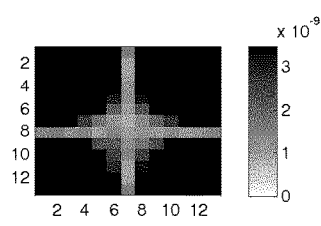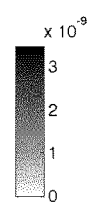
FIG. 11A　　　　　　FIG. 11B　　　　　　FIG. 11C
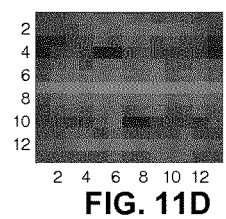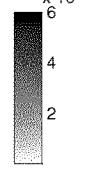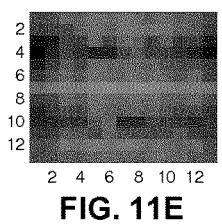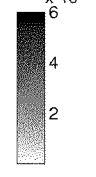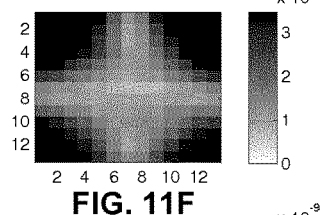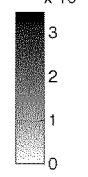
FIG. 11D　　　　　　FIG. 11E　　　　　　FIG. 11F
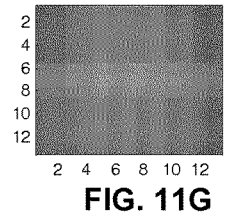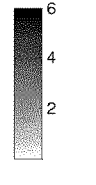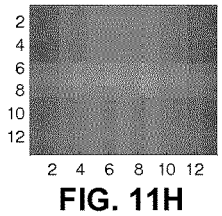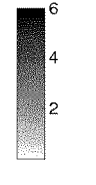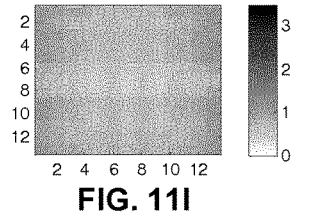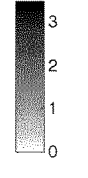
FIG. 11G　　　　　　FIG. 11H　　　　　　FIG. 11I

LITHOGRAPHIC METHOD AND APPARATUS

CROSS-REFERENCE TO RELATED APPLICATIONS

This application claims priority of EP application 15164277.4 which was filed on Apr. 20, 2015 and which is incorporated herein in its entirety by reference.

FIELD

The present invention relates to a method of determining aberrations caused by a projection system. The method may be used in connection with a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Radiation that has been patterned by the patterning device is focussed onto the substrate using a projection system. The projection system may introduce optical aberrations, which cause the image formed on the substrate to deviate from that which is imparted by the patterning device. It is desirable to determine such aberrations.

It is an object of the present invention to provide a method of determining aberrations caused by a projection system which at least partially addresses one or more of the problems of the prior art, whether identified herein or elsewhere.

SUMMARY

According to a first aspect of the invention, there is provided a method of determining aberrations caused by a projection system, the method comprising illuminating a patterning device with radiation, wherein the patterning device comprises a plurality of patterned regions, each patterned region patterning a measurement beam, projecting, with the projection system, the measurement beams onto a sensor apparatus comprising a plurality of detector regions, making a first measurement of radiation at the detector regions when the patterning device and the sensor apparatus are positioned in a first relative configuration in which at least some of the plurality of detector regions each receive a measurement beam, moving at least one of the patterning device and the sensor apparatus in a first direction so as to change the relative configuration of the patterning device to a second relative configuration, making a second measurement of radiation at the detector regions when the patterning device and the sensor apparatus are positioned in the second relative configuration in which at least some of the plurality of detector regions receive a different measurement beam to the measurement beam which was received at the respective detector region when the patterning device and the sensor apparatus were positioned in the first relative configuration and determining from the first measurement and the second measurement the aberrations caused by the projection system.

Measuring one or more measurement beams whilst the patterning device and the sensor apparatus are in the first and second relative configurations allows a given measurement beam to be measured at a plurality of different detector regions. This may provide information about properties of the sensor apparatus and/or the patterning device, such as the configuration, position and orientation of the sensor apparatus and/or the patterning device. Different measurements of a measurement beam which are made at different detector regions may be combined to derive aberrations which are caused by the projection system whilst accounting for unknown properties of the sensor apparatus and/or the patterning device. This allows both lower order (e.g. relating to Zernike coefficients having a Noll index of four or less) and higher order aberrations (e.g. relating to Zernike coefficients having a Noll index of five or more) to be determined from the same set of measurements. The projection system may be adjusted in response to the determined aberrations in a single adjustment process. This advantageously provides a substantial time saving (e.g. when compared to an iterative calibration process in which different aberrations are determined and adjustments made multiple times).

The first and/or the second relative configurations may comprise the patterning device and the sensor apparatus being in a single fixed position or may comprise the patterning device and/or the sensor apparatus being in a plurality of different positions. The patterning device and the sensor apparatus remain in the first or second relative configuration even during movement of the patterning device and/or the sensor apparatus whilst the respective measurement beams which are received at the respective detector regions remain the same.

The first measurement and/or the second measurement may comprise a single measurement or may comprise a plurality of measurements. For example, the first and/or the second measurements may comprise a plurality of measurements which are made during movement of the patterning device and/or the sensor apparatus whilst the patterning device and the sensor apparatus are in the same relative configuration. The first measurement may comprise any measurement made whilst the patterning device and the sensor apparatus are in the first relative configuration. The second measurement may comprise any measurement made whilst the patterning device and the sensor apparatus are in the second relative configuration.

Determining aberrations caused by the projection system may comprise determining the placement of a wavefront which is projected by the projection system. For example, determining aberrations caused by the projection system may comprise determining aberrations related to second, third and/or fourth Zernike coefficients. Determining aberrations caused by the projection system may comprise determining higher order aberrations. For example, determining aberrations caused by the projection system may comprise determining aberrations related to Zernike coefficients having a Noll index of 5 or more.

The measurement beams may be formed by the patterned regions. For example, one or more regions of the patterning device may be illuminated with radiation and radiation which is transmitted or reflected by a patterned region may form a measurement beam. Alternatively the measurement beams may be formed prior to illuminating the patterning device and each measurement beam may be directed to illuminate a patterned region. For example, an illumination system may split a radiation beam into a plurality of measurement beams and direct each measurement beam to be incident on a patterned region of the patterning device.

Moving at least one of the patterning device and the sensor apparatus may comprise moving the sensor apparatus in the first direction.

At least some of the detector regions of the sensor apparatus may be spaced apart from each other in the first direction.

Moving the sensor apparatus in the first direction may comprise stepping the sensor apparatus by a distance in the first direction which is approximately equal to a separation between detector regions in the first direction.

The method may further comprise moving at least one of the patterning device and the sensor apparatus so as to change the relative configuration of the patterning device to a third relative configuration and making a third measurement of radiation at the detector regions when the patterning device and the sensor apparatus are positioned in the third relative configuration in which at least some of the plurality of detector regions receive a different measurement beam to the measurement beam which was received at the respective detector region when the patterning device and the sensor apparatus were positioned in the first relative configuration and in the second relative configuration.

Moving at least one of the patterning device and the sensor apparatus so as to change the relative configuration of the patterning device and the sensor apparatus to the third configuration may comprise moving at least one of the patterning device and the sensor apparatus in a second direction, wherein the second direction is different to the first direction.

Moving at least one of the patterning device and the sensor apparatus in the second direction may comprise moving the sensor apparatus in the second direction.

At least some of the detector regions of the sensor apparatus may be spaced apart from each other in the second direction.

Moving the sensor apparatus in the second direction may comprise stepping the sensor apparatus by a distance in the second direction which is approximately equal to a separation between detector regions in the second direction.

The second direction may be approximately perpendicular to the first direction.

The method may comprise moving at least one of the patterning device and the sensor apparatus between a plurality of different relative configurations in which at least some of the plurality of detector regions receive a different measurement beam to a measurement beam received at the respective detector region when the patterning device and the sensor apparatus are positioned in a different one of the plurality of relative configurations, and wherein in each of the plurality of relative configurations a measurement of radiation at the detector regions is made so as to perform a plurality of measurements made at a plurality of different relative configurations, and wherein determining aberrations caused by the projection system comprises determining the aberrations from the plurality of measurements.

The plurality of different relative configurations may include relative configurations which are separated from each other in a first direction and relative configurations which are separated from each other in a second direction different to the first direction.

The second direction may be substantially perpendicular to the first direction.

The plurality of different relative configurations may have a maximum extent in the second direction and the plurality of different relative configurations may include relative configurations at extremes of the maximum extent in the second direction, at a plurality of positions in the first direction.

The plurality of different relative configurations may be arranged to substantially form a rectangle.

The plurality of different relative configurations may be arranged to substantially form a square.

Moving at least one of the patterning device and the sensor apparatus may comprise moving the patterning device.

At least one of the patterned regions may comprise a diffraction grating configured to modify a measurement beam.

At least one of the detector regions may comprise a diffraction grating and a radiation sensor, wherein the diffraction grating is configured to modify a measurement beam and the radiation sensor is configured to receive and measure the modified measurement beam.

The method may further comprise moving at least one of the patterning device and the sensor apparatus whilst the patterning device and the sensor apparatus are in the first and/or the second relative configuration, wherein the movement is such that the measurement beams which are received at the detector regions remains the same throughout the movement.

Measurements of radiation may be made by the sensor apparatus during the movement of the patterning device and/or the sensor apparatus. The measurements may be considered to form a single measurement. For example, the measurements may form the first measurement or may form the second measurement.

The first measurement and/or the second measurement may comprise measuring variations in radiation at the detector regions during the movement of at least one of the patterning device and the sensor apparatus.

Determining aberrations which are caused by the projection system may comprise determining the placement of the patterned regions and/or the detector regions.

Determining the placement of the patterned regions and/or the detector regions comprises deriving Zernike polynomial coefficients having a Noll index of 4 or less.

The method may further comprise using the first and second measurements to derive Zernike polynomial coefficients having a Noll index of 5 or more.

Determining aberrations which are caused by the projection system may comprise making one or more physical assumptions about the sensor apparatus and/or the patterning device.

Determining aberrations which are caused by the projection system may comprise making a first set of one or more physical assumptions in order to determine a first set of one or more aberrations and making a second set of one or more physical assumptions in order to determine a second set of one or more aberrations.

The first set of one or more aberrations may comprise a first Zernike coefficient having a first Noll index and the second set of aberrations may comprise a second Zernike coefficients a second Noll index which is different to the first Noll index.

The one or more physical assumptions about the sensor apparatus and/or the patterning device may include at least one of assuming that each detector region has an associated offset and that the sum of the offsets is equal to zero, assuming that each patterned region has an associated offset and that the sum of the offsets is equal to zero, assuming that the magnification of the sensor apparatus is equal to a desired magnification and assuming that the magnification of the patterning device is equal to a desired magnification.

The one or more physical assumptions about the sensor apparatus and/or the patterning device may include at least one of: assuming that each detector regions has an associated offset and that the sum of the offsets in a first direction and a sum of the offsets in a second direction, perpendicular to the first direction are equal to zero; assuming that each patterned region has an associated offsets and that the sum of the offsets in the first direction and a sum of the offsets in the second direction, are equal to zero; assuming that the magnification of the sensor apparatus is equal to a design magnification in both the first and second directions; assuming that the sensor apparatus is not tilted in the first direction or in the second direction; and assuming that the movements of at least one of the patterning device and the sensor apparatus do not include any offsets in the form of a rotation about a third direction, wherein the third direction is perpendicular to both the first and second directions.

The one or more physical assumptions about the sensor apparatus and/or the patterning device may include at least one of: assuming that each detector region has an associated offset and that the sum of the offsets in a third direction is equal to zero; assuming that each patterned region has an associated offset and the sum of the offsets in the third direction is equal to zero; assuming that the positions of each detector region in the third direction is not a function of position in a first and second direction, wherein the first, second and third directions are each perpendicular to each other; assuming that the movements of at least one of the patterning device and the sensor apparatus do not include any offsets in the form of a rotation about the first direction or a rotation about the second direction; and assuming that the movements of at least one of the patterning device and the sensor apparatus do not include any curvature in the first direction or in the second direction and do not include any offsets which are a function of a multiple of position in the first direction and position in the second direction.

According to a second aspect of the invention there is provided a measurement system for determining aberrations caused by a projection system, the measurement system comprising a patterning device comprising a plurality of patterned regions, wherein each patterned region is configured to pattern a measurement beam when illuminated with radiation an illumination system arranged to illuminate the patterning device with radiation a sensor apparatus comprising a plurality of detector regions, wherein the sensor apparatus is configured to measure the radiation at the detector regions the projection system being configured to project the measurement beams onto the sensor apparatus a positioning apparatus configured to move at least one of the patterning device and the sensor apparatus in a first direction so as to change the relative configuration of the patterning device and the sensor apparatus between a first relative configuration and a second relative configuration and a controller configured to receive a first measurement of radiation at the detector regions of the sensor apparatus when the patterning device and the sensor apparatus are positioned in the first relative configuration in which at least some of the plurality of detector regions each receive at least one of the measurement beams, receive a second measurement of radiation at the detector regions of the sensor apparatus when the patterning device and the sensor apparatus are positioned in the second relative configuration in which at least some of the plurality of detector regions receive a different measurement beam to the measurement beam which is received at the respective detector region when the patterning device and the sensor apparatus are positioned in the first relative configuration and determine, from the first measurement and the second measurement, aberrations caused by the projection system.

The positioning apparatus may be configured to move the sensor apparatus in the first direction.

At least some of the detector regions of the sensor apparatus may be spaced apart from each other in the first direction.

The positioning apparatus may be configured to step the sensor apparatus by a distance in the first direction which is approximately equal to a separation between detector regions in the first direction.

The positioning apparatus may be further configured to move at least one of the patterning device and the sensor apparatus so as to change the relative configuration of the patterning device and the sensor apparatus to a third relative configuration and the controller may be further configured to receive a third measurement of radiation at the detector regions when the patterning device and the sensor apparatus are positioned in the third relative configuration in which at least some of the plurality of detector regions receive a different measurement beam to the measurement beam which was received at the respective detector region when the patterning device and the sensor apparatus were positioned in the first relative configuration and in the second relative configuration.

The positioning apparatus may be configured to move at least one of the patterning device and the sensor apparatus in a second direction so as to change the relative configuration of the patterning device and the sensor apparatus between the first configuration and/or the second configuration and the third configuration, wherein the second direction is different to the first direction.

The positioning apparatus may be configured to move the sensor apparatus in the second direction.

At least some of the detector regions of the sensor apparatus may be spaced apart from each other in the second direction.

The positioning apparatus may be configured to step the sensor apparatus by a distance in the second direction which is approximately equal to a separation between detector regions in the second direction.

The second direction may be approximately perpendicular to the first direction.

The positioning apparatus may be configured to move at least one of the patterning device and the sensor apparatus between a plurality of different relative configurations in which at least some of the plurality of detector regions receive a different measurement beam to a measurement beam received at the respective detector region when the patterning device and the sensor apparatus are positioned in a different one of the plurality of relative configurations, and wherein the sensor apparatus is configured to measure radiation at the detector regions in each of the plurality of relative configurations so as to perform a plurality of measurements made at a plurality of different relative configurations, and wherein the controller is configured to determine aberrations caused by the projection system from the plurality of measurements.

The plurality of different relative configurations may include relative configurations which are separated from each other in a first direction and relative configurations which are separated from each other in a second direction different to the first direction.

The second direction may be substantially perpendicular to the first direction.

The plurality of different relative configurations may have a maximum extent in the second direction and the plurality of different relative configurations may include relative configurations at extremes of the maximum extent in the second direction, at a plurality of positions in the first direction.

The plurality of different relative configurations may be arranged to substantially form a rectangle.

The positioning apparatus may be configured to move the patterning device.

At least one of the patterned regions may comprise a diffraction grating configured to modify a measurement beam.

At least one of the detector regions may comprise a diffraction grating and a radiation sensor, wherein the diffraction grating is configured to modify a measurement beam and the radiation sensor is configured to receive and measure the modified measurement beam.

The controller may be configured to use the first and second measurements to determine the placement of the patterned regions and/or the detector regions in order to determine aberrations caused by the projection system.

Determining the placement of the patterned regions and/or the detector regions may comprise deriving Zernike polynomial coefficients having a Noll index of 4 or less.

The controller may be further configured to use the first and second measurements to determine Zernike polynomial coefficients having a Noll index of 5 or more.

According to a third aspect of the invention there is provided a lithographic apparatus comprising a measurement system according to the second aspect.

According to a fourth aspect of the invention there is provided a method of determining aberrations caused by a projection system, the method comprising illuminating a patterning device with radiation, wherein the patterning device comprises a patterned region which forms a measurement beam, projecting, with the projection system, the measurement beam onto a sensor apparatus comprising a first detector region and a second detector region, making a first measurement of radiation at the first detector region when the patterning device and the sensor apparatus are positioned in a first relative configuration in which the first detector region receives the measurement beam, moving the sensor apparatus such that the patterning device and the sensor apparatus are positioned in a second relative configuration in which the second detector region receives the measurement beam, making a second measurement of radiation at the second detector region when the patterning device and the sensor apparatus are positioned in the second relative configuration and determining from the first measurement and the second measurement the aberrations caused by the projection system.

According to a fifth aspect of the invention there is provided a method of determining aberrations caused by a projection system, the method comprising illuminating a patterning device with radiation, wherein the patterning device comprises a first patterned region which forms a first measurement beam and a second patterned region which forms a second measurement beam, projecting, with the projection system, the measurement beams onto a sensor apparatus comprising a detector region, making a first measurement of radiation at the detector region when the patterning device and the sensor apparatus are positioned in a first relative configuration in which the detector region receives the first measurement beam, moving the patterning device such that the patterning device and the sensor apparatus are positioned in a second relative configuration in which the detector region receives the second measurement beam, making a second measurement of radiation at the detector region when the patterning device and the sensor apparatus are positioned in the second relative configuration and determining from the first measurement and the second measurement the aberrations caused by the projection system.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 11A-11I are schematic representations of uncertainties associated with aberration determinations made using the embodiments of FIGS. 7A-7C, 9A-9C and 10A-10C.

DETAILED DESCRIPTION

Figure 1:
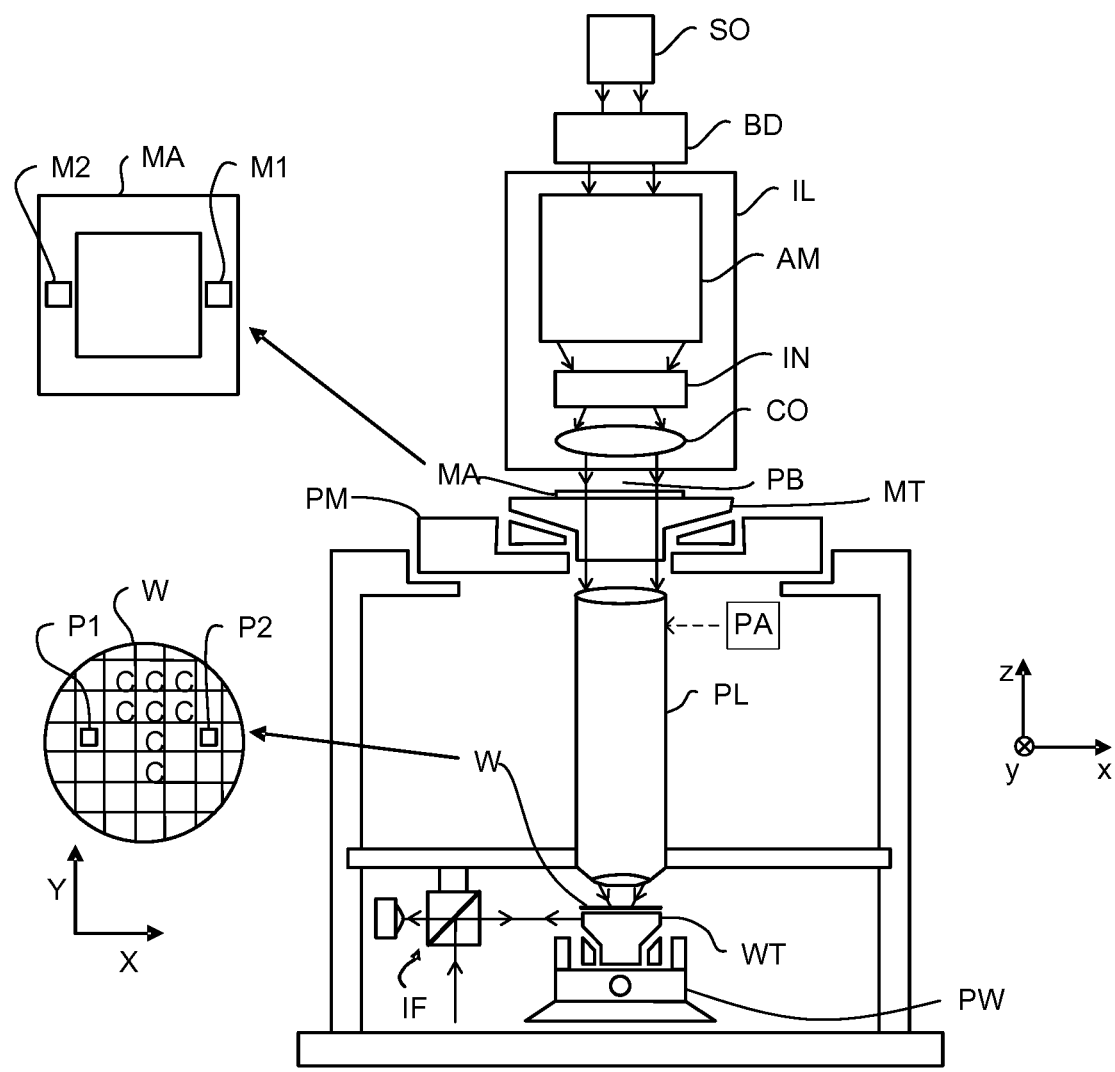
FIG. 1 is a schematic illustration of a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 4-20 nm), as well as particle beams, such as ion beams or electron beams.

The term "patterning device" used herein should be broadly interpreted as referring to a device that can be used to impart a radiation beam with a pattern in its cross-section. For example, a radiation beam may be imparted with a pattern in its cross-section in order to create a pattern in a target portion of a substrate. Additionally or alternatively a radiation beam may be imparted with a pattern in its cross-section in order to illuminate a sensor apparatus with a patterned radiation beam. It should be noted that when a pattern is created in a target portion of a substrate, the pattern imparted to a radiation beam may not exactly correspond to a desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus. The apparatus comprises:
  an illumination system (illuminator) IL to condition a beam PB of radiation (e.g. UV radiation or DUV radiation).
  a support structure MT to support a patterning device (e.g. a mask) MA and connected to first positioning device PM to accurately position the patterning device with respect to item PL;
  a substrate table (e.g. a wafer table) WT for holding a substrate (e.g. a resist coated wafer) W and connected to second positioning device PW for accurately positioning the substrate with respect to item PL; and
  a projection system (e.g. a refractive projection lens) PL configured to image a pattern imparted to the radiation beam PB by patterning device MA onto a target portion C (e.g. comprising one or more dies) of the substrate W.

Also shown in FIG. 1 are Cartesian co-ordinates which are used consistently throughout the Figures.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may also be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained by inserting an optic which provides that illumination mode into the illuminator IL.

In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:
1. In step mode, the support structure MT and the substrate table WT are kept essentially stationary, while an entire pattern imparted to the beam PB is projected onto a target portion C in one go (i.e. a single static exposure). The substrate table WT is then shifted in the x and/or y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The projection system PL has an optical transfer function which may be non-uniform, which can affect the pattern which is imaged on the substrate W. For unpolarized radiation such effects can be fairly well described by two scalar maps, which describe the transmission (apodization) and relative phase (aberration) of radiation exiting the projection system PL as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PL will have a different Zernike expansion for each field point (i.e. for each spatial location in its image plane).

As will be described in further detail below, the relative phase of the projection system PL in its pupil plane may be determined by projecting radiation from an object plane of the projection system PL (i.e. the plane of the patterning device MA), through the projection system PL and using a shearing interferometer to measure a wavefront (i.e. a locus of points with the same phase). The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PL.

The projection system PL may comprise a plurality of lens elements and may further comprise adjusting means PA for adjusting the lens elements so as to correct for aberrations (any type of phase variation across the pupil plane throughout the field). To achieve this, the adjusting means PA may be operable to manipulate lens elements within the projection system PL in one or more different ways. The projection system may have a co-ordinate system wherein its optical axis extends in the z direction. The adjusting means PA may be operable to do any combination of the following: displace one or more lens elements; tilt one or more lens elements; and/or deform one or more lens elements. Displacement of lens elements may be in any direction (x, y, z or a combination thereof). Tilting of lens elements is typically out of a plane perpendicular to the optical axis, by rotating about axes in the x or y directions although a rotation about the z axis may be used for non-rotationally symmetric aspherical lens elements. Deformation of lens elements may include both low frequency shapes (e.g. astigmatic) and high frequency shapes (e.g. free form aspheres). Deformation of a lens element may be performed for example by using actuators to exert force on sides of the lens element and/or by using heating elements to heat selected regions of the lens element. In general, it may not be possible to adjust the projection system PL to correct for apodizations (transmission variation across the pupil plane). The transmission map of a projection system PL may be used when designing masks MAs for the lithographic apparatus LA.

A projection system PL which forms part of a lithographic apparatus may periodically undergo a calibration process. For example, when a lithographic apparatus is manufactured in a factory the optical elements (e.g. lenses) which form the projection system PL may be set up by performing an initial calibration process. After installation of a lithographic apparatus at a site at which the lithographic apparatus is to be used, the projection system PL may once again be calibrated. Further calibrations of the projection system PL may be performed at regular intervals. For example, under normal use the projections system PL may be calibrated every few months (e.g. every three months).

Calibrating a projection system PL may comprise passing radiation through the projection system PL and measuring the resultant projected radiation. Measurements of the projected radiation may be used to determine aberrations in the projected radiation which are caused by the projection system PL. Aberrations which are caused by the projection system PL may be determined using a measurement system. In response to the determined aberrations, the optical elements which form the projection system PL may be adjusted so as to correct for the aberrations which are caused by the projection system PL.

Figure 2:
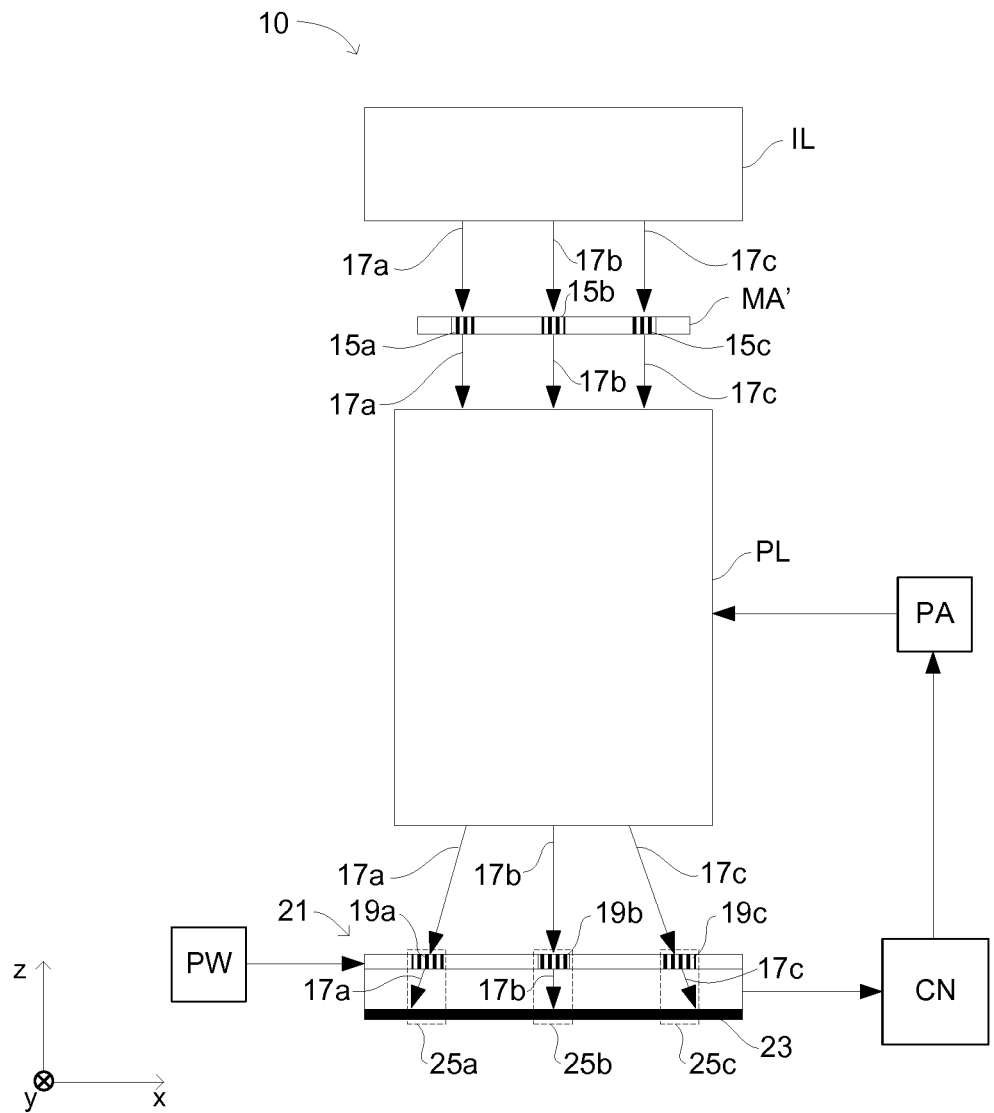
FIG. 2 is a schematic illustration of a measurement system according to an embodiment of the invention.

FIG. 2 is a schematic illustration of a measurement system 10 which may be used to determine aberrations which are caused by a projection system PL. The measurement system 10 comprises an illumination system IL, a measurement patterning device MA', a sensor apparatus 21 and a controller CN. The measurement system 10 may form part of a lithographic apparatus. For example, the illumination system IL and the projection system PL which are shown in FIG. 2 may be the illumination system IL and projection system PL of the lithographic apparatus which is shown in FIG. 1. For ease of illustration additional components of a lithographic apparatus (e.g. a radiation source SO) are not shown in FIG. 2.

The measurement patterning device MA' is arranged to receive radiation from the illumination system IL. The sensor apparatus 21 is arranged to receive radiation from the projection system PL. During normal use of a lithographic apparatus, the measurement patterning device MA' and the sensor apparatus 21 which are shown in FIG. 2 may not be located in the positions in which they are shown in FIG. 2. For example, during normal use of a lithographic apparatus a patterning device MA which is configured to form a pattern to be transferred to a substrate W may be positioned to receive radiation from the illumination system IL and a substrate W may be positioned to receive radiation from the projection system PL (as is shown, for example, in FIG. 1).

The measurement patterning device MA' and the sensor apparatus 21 may be moved into the positions in which they are shown in FIG. 2 in order to determine aberrations which are caused by the projection system PL. The measurement patterning device MA' may be supported by a support structure MT, such as the support structure which is shown in FIG. 1. The sensor apparatus 21 may be supported by a substrate table, such as the substrate table WT which is shown in FIG. 1. Alternatively the sensor apparatus 21 may be supported by a measurement table (not shown) which may be separate to the sensor table WT.

Figure 3A:
FIGS. 3A and 3B are schematic illustrations of a patterning device and a sensor apparatus which may form part of the measurement system of FIG. 2.
Figure 3B:
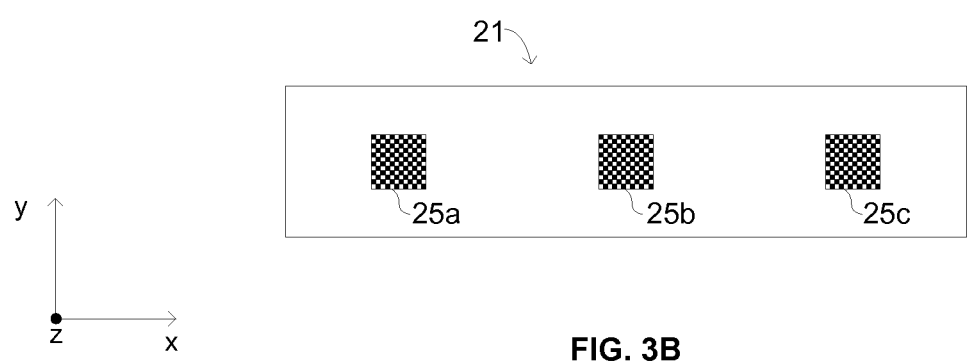

The measurement patterning device MA' and the sensor apparatus 21 are shown in more detail in FIGS. 3A and 3B. Cartesian co-ordinates are used consistently in FIGS. 2, 3A and 3B. FIG. 3A is a schematic illustration of the measurement patterning device MA' in an x-y plan and FIG. 3B is a schematic illustration of the sensor apparatus 21 in an x-y plane.

The measurement patterning device MA' comprises a plurality of patterned regions 15a-15c. In the embodiment which is shown in FIGS. 2 and 3A the measurement patterning device MA' is a transmissive patterning device MA'. The patterned regions 15a-15c each comprise an opening in the measurement patterning device MA', in which a transmissive diffraction grating is disposed. Radiation which is incident on the patterned regions 15a-15c of the measurement patterning device MA' is at least partially transmitted, and radiation which is incident on the remainder of the measurement patterning device MA' is not transmitted.

The illumination system IL illuminates the measurement patterning device MA' with radiation. Whilst not shown in FIG. 2, the illumination system IL may receive radiation from a radiation source SO and condition the radiation so as to illuminate the measurement patterning device MA'. For example, the illumination system IL may condition the radiation so as to provide radiation having a desired spatial and angular distribution. In the embodiment which is shown in FIG. 2, the illumination system IL is configured to form separate measurement beams 17a-17c. Each measurement beam 17a-17c illuminates a respective patterned region 15a-15c of the measurement patterning device MA'.

In order to perform a determination of aberrations which are caused by the projection system PL, a mode of the illumination system IL may be changed in order to illuminate the measurement patterning device MA' with separate measurement beams 17a-17c. For example, during normal operation of a lithographic apparatus, the illumination system IL may be configured to illuminate a patterning device MA with a slit of radiation. However the mode of the illumination system IL may be changed such that the illumination system IL is configured to form separate measurement beams 17a-17c in order to perform a determination of aberrations caused by the projection system PL. In some embodiments different patterned regions 15a-15c may be illuminated at different times. For example, a first subset of the patterned regions 15a-15c may be illuminated at a first time so as to form a first subset of measurement beams 17a-17c and a second subset of patterned regions 15a-15c may be illuminated at a second time so as to form a second subset of measurement beams 17a-17c.

In other embodiments the mode of the illumination system IL may not be changed in order to perform a determination of aberrations caused by the projection system PL. For example, the illumination system IL may be configured to illuminate the measurement patterning device MA' with a slit of radiation (e.g. which substantially corresponds with an illumination area used during exposure of substrates).

Separate measurement beams 17a-17c may then be formed by the measurement patterning device MA' since only the patterned regions 15a-15c transmit radiation.

In the Figures the Cartesian co-ordinate system is shown as being conserved through the projection system PL. However, in some embodiments the properties of the projection system PL may lead to a transformation of the co-ordinate system. For example, the projection system PL may form an image of the measurement patterning device MA' which is magnified, rotated and/or mirrored relative to the measurement patterning device MA'. In some embodiments the projection system PL may rotate an image of the measurement patterning device MA' by approximately 180° around the z-axis. In such an embodiment the relative positions of a first measurement beam 17a and a third measurement beam 17c which are shown in FIG. 2, may be swapped. In other embodiments the image may be mirrored about an axis which may lie in an x-y plane. For example, the image may be mirrored about the x-axis or about the y-axis.

In embodiments in which the projection system PL rotates an image of the measurement patterning device MA' and/or the image is mirrored by the projection system PL, the projection system is considered to transform the co-ordinate system. That is, the co-ordinate system which is referred to herein is defined relative to an image which is projected by the projection system PL and any rotation and/or mirroring of the image causes a corresponding rotation and/or mirroring of the co-ordinate system. For ease of illustration, the co-ordinate system is shown in the Figures as being conserved by the projection system PL. However, in some embodiments the co-ordinate system may be transformed by the projection system PL.

The patterned regions 15a-15c modify the measurement beams 17a-17c. In particular, the patterned regions 15a-15c cause a spatial modulation of the measurement beams 17a-17c and cause diffraction in the measurement beams 17a-17c. In the embodiment which is shown in FIG. 3B the patterned regions 15a-15c each comprise two distinct portions. For example, a first patterned region 15a comprises a first portion 15a' and a second portion 15a". The first portion 15a' comprises a diffraction grating which is aligned parallel to a u-direction and the second portion 15a" comprises a diffraction grating which is aligned parallel to a v-direction. The u and v-directions are depicted in FIG. 3A. The u and v-directions are both aligned at approximately 45° relative to both the x and y-directions and are aligned perpendicular to each other. Second 15b and third 15c patterned regions which are shown in FIG. 3A are identical to the first patterned region 15a and each comprise first and second portions whose diffraction gratings are aligned perpendicular to each other.

The first and second portions of the patterned regions 15a-15c may be illuminated with the measurement beams 17a-17c at different times. For example, the first portions of each of the patterned regions 15a-15c may be illuminated by the measurement beams 17a-17c at a first time. At a second time the second portions of each of the patterned regions 15a-15c may be illuminated by the measurement beams 17a-17c. As was mentioned above in some embodiments different patterned regions 15a-15c may be illuminated at different times. For example, the first portions of a first subset of patterned regions 15a-15c may be illuminated at a first time and the first portions of a second subset of patterned regions 15a-15c may be illuminated at a second time. Second portions of the first and second subsets of patterned regions may be illuminated at the same or different times. In general any schedule of illuminating different portions of patterned regions 15a-15c may be used.

The modified measurement beams 17a-17c are input to the projection system PL. The projection system PL forms an image of the modified measurement beams 17a-17c which is projected on to the sensor apparatus 21. The sensor apparatus 21 comprises a plurality of diffraction gratings 19a-19c and a radiation detector 23. The diffraction gratings 19a-19c are arranged such that each diffraction grating 19a-19c receives a respective modified measurement beam 17a-17c which is output from the projection system PL. The modified measurement beams 17a-17c which are incident on the diffraction gratings 19a-19c are further modified by the diffraction gratings 19a-19c. The modified measurement beams which are transmitted at the diffraction gratings 19a-19c are incident on the radiation detector 23.

The radiation detector 23 is configured to detect the spatial intensity profile of radiation which is incident on the radiation detector 23. The radiation detector 23 may, for example, comprise an array of individual detector elements. For example, the radiation detector 23 may comprise a CCD array. The diffraction gratings 19a-19c and portions of the radiation sensor 23 at which the modified measurement beams 17a-17c are received form detector regions 25a-25c. For example, a first diffraction grating 19a and a first portion of the radiation sensor 23 at which a first measurement beam 17a is received together form a first detector region 25a. A measurement of a given measurement beam 17a-17c may be made at a respective detector region 25a-25c (as depicted). As was described above, in some embodiments the relative positioning of the modified measurement beams 17a-17c and the co-ordinate system may be transformed by the projection system PL.

The modification of the measurement beams 17a-17c which occurs at the patterned regions 15a-15c and the diffraction gratings 19a-19c of the detector regions 25a-25c results in interference patterns being formed on the radiation detector 23. The interference patterns are related to the derivative of the phase of the measurement beams and depend on aberrations which are present in wavefronts which have propagated through the projection system. The interference patterns may therefore be used to determine aberrations which are caused by the projection system PL. As will be described in further detail below, the interference patterns may also depend on the configuration and relative positioning of the patterned regions 15a-15c and detector regions 17a-17c.

In the embodiment which is shown in FIG. 3B the detector regions 25a-25c each comprise a diffraction grating 19a-19c which is configured in the form of a checkerboard. As was described above, the first and second portions of the patterned regions 15a-15c may be illuminated at different times. Illumination of the first portions of the patterned regions 15a-15c may provide information related to aberrations in a first direction and illumination of the second portions of the patterned regions 15a-15c may provide information related to aberrations in a second direction.

In some embodiments, the measurement patterning device MA' and/or the sensor apparatus 21 is sequentially scanned and/or stepped in two perpendicular directions. For example, the measurement patterning device MA' and/or the sensor apparatus 21 may be stepped relative to each other in the u and v-directions. The measurement patterning device MA' and/or the sensor apparatus 21 may be stepped in the u-direction whilst the second portions 15a"-15c" of the patterned regions 15a-15c are illuminated and the measurement patterning device MA' and/or the sensor apparatus 21 may be stepped in the v-direction whilst the first portions 15a'-15c' of the patterned regions 15a-15c are illuminated. That is, the measurement patterning device MA' and/or the sensor apparatus 21 may be stepped in a direction which is perpendicular to the alignment of a diffraction grating which is being illuminated.

The measurement patterning device MA' and/or the sensor apparatus 21 may be stepped by distances which correspond with a fraction of the grating period of the diffraction gratings. Measurements which are made at different stepping positions may be analysed in order to derive information about a wavefront in the stepping direction. For example, the phase of the first harmonic of the measured signal may contain information about the derivative of a wavefront in the stepping direction. Stepping the measurement patterning device MA' and/or the sensor apparatus 21 in both the u and v-directions (which are perpendicular to each other) therefore allows information about a wavefront to be derived in two perpendicular directions, thereby allowing the full wavefront to be reconstructed.

In addition to stepping of the measurement patterning device MA' and/or the sensor apparatus 21 in a direction which is perpendicular to the alignment of a diffraction grating which is being illuminated (as was described above), the measurement patterning device MA' and/or the sensor apparatus 21 may also be scanned relative to each other. Scanning of the measurement patterning device MA' and/or the sensor apparatus 21 may be performed in a direction which is parallel to the alignment of a diffraction grating which is being illuminated. For example, the measurement patterning device MA' and/or the sensor apparatus 21 may be scanned in the u-direction whilst the first portions 15a'-15c' of the patterned regions 15a-15c are illuminated and the measurement patterning device MA' and/or the sensor apparatus 21 may be scanned in the v-direction whilst the second portions 15a''-15c'' of the patterned regions 15a-15c are illuminated. Scanning of the measurement patterning device MA' and/or the sensor apparatus 21 in a direction which is parallel to the alignment of a diffraction grating which is being illuminated allows measurements to be averaged out across the diffraction grating, thereby accounting for any variations in the diffraction grating in the scanning direction. Scanning of the measurement patterning device MA' and/or the sensor apparatus 21 may be performed at a different time to the stepping of the measurement patterning device MA' and/or the sensor apparatus 21 which was described above.

As was described above the detector regions 25a-25c in the embodiment shown in FIG. 3B each comprise a diffraction grating which is configured in the form of a checkerboard. This may allow the detector regions 25a-25c to be used during a determination of wavefront phase variations in both the u-direction and the v-direction. In other embodiments, the detector regions 25a-25c may each comprise a first portion and a second portion. The first portions of the detector regions may each comprise a diffraction grating arranged in a first configuration and the second portions of the detector regions may each comprise a diffraction grating arranged in a second configuration. The sensor apparatus 21 may be arranged such that the first portions of the detector regions 25a-25c receive the modified measurement beams 17a-17c during a determination of phase variations in a first direction (e.g. the u-direction) and the second portions of the detector regions 25a-25c receive the modified measurement beams 17a-17c during a determination of phase variations in a second direction (e.g. the v-direction).

The arrangements of diffraction gratings which form the patterned regions 15a-15c and the detector regions 25a-25c in the embodiment which is shown in FIGS. 2, 3A and 3B are presented merely as an example embodiment. It will be appreciated that a variety of different arrangements of the patterned regions 15a-15c and the detector regions 25a-25c may be used in order to determine aberrations caused by the projection system PL. The patterned regions 15a-15c and/or the detector regions 25a-25c may comprise diffraction gratings. Diffraction gratings which form the patterned regions 15a-15c may each share a common grid such that the pitch of each of the diffraction gratings is the same. Similarly, diffraction gratings which form the detector regions 25a-25c may each share a common gird such that the pitch of each of the diffraction gratings is the same. In some embodiments, the patterned regions 15a-15c and the detector regions 25a-25c share a common grid. That is, the spacing between patterned regions 15a-15c may correspond with the spacing between the detector regions 25a-25c.

In some embodiments the patterned regions 15a-15c and/or the detector regions 25a-25c may comprise components other than a diffraction grating. For example, in some embodiments the patterned regions 15a-15c and/or the detector regions may comprise a single slit or a pin-hole opening through which at least a portion of a measurement beam 17a-17c may propagate. In general the patterned regions and/or the detector regions may comprise any arrangement which serves to modify the measurement beams.

Whilst, in the embodiment which is shown in FIGS. 2, 3A and 3B the measurement patterning device MA' comprises three patterned regions 15a-15c and the sensor apparatus 21 comprises three detector regions 25a-25c, in other embodiments the measurement patterning device MA' may comprise more or less than three patterned regions 15a-15c and/or the sensor apparatus 21 may comprise more or less than three detector regions 25a-25c. In general any number and configuration of patterned regions 15a-15c and detector regions 25a-25c may be used which modify the measurement beams 17a-17c such that measurements made at the radiation sensor 23 provides information about aberrations which are caused by the projection system.

The controller CN receives measurements made at the sensor apparatus 21 and determines, from the measurements, aberrations which are caused by the projection system PL. The controller may be configured to control one or more components of the measurement system 10. For example, the controller CN may control a positioning apparatus PW which is operable to move the sensor apparatus 21 and/or the measurement patterning device MA' relative to each other. The controller may control an adjusting means PA for adjusting components of the projection system PL. For example, the adjusting means PA may adjust lens elements of the projection system PL so as to correct for aberrations which are caused by the projection system PL and which are determined by the controller CN.

Determining aberrations which are caused by the projection system PL may comprise fitting the measurements which are made by the sensor apparatus 21 to Zernike polynomials in order to obtain Zernike coefficients. Different Zernike coefficients may provide information about different forms of aberration which are caused by the projection system PL. Zernike coefficients may be determined independently at different positions in the x and/or the y-directions. For example, in the embodiment which is shown in FIGS. 2, 3A and 3B, Zernike coefficients may be determined for each measurement beam 17a-17c.

In some embodiments the measurement patterning device MA' may comprise more than three patterned regions, the sensor apparatus 21 may comprise more than three detector regions and more than three measurement beams may be formed. This may allow the Zernike coefficients to be determined at more positions. In some embodiments the patterned regions and the detector regions may be distributed at different positions in both the x and y-directions. This may allow the Zernike coefficients to be determined at positions which are separated in both the x and the y-directions.

As was mentioned above different Zernike coefficients may provide information about different forms of aberration which are caused by the projection system PL. Typically Zernike polynomials are considered to comprise a plurality of orders, each order having an associated Zernike coefficient. The orders and coefficients may be labelled with an index, which is commonly referred to as a Noll index. The Zernike coefficient having a Noll index of 1 may be referred to as the first Zernike coefficient, the Zernike coefficient having a Noll index of 2 may be referred to as the second Zernike coefficient and so on.

The first Zernike coefficient relates to a mean value (which may be referred to as a piston) of a measured wavefront. The first Zernike coefficient may not be relevant to the performance of the projection system PL and as such may not be determined using the methods described herein. The second Zernike coefficient relates to the tilt of a measured wavefront in the x-direction. The tilt of a wavefront in the x-direction is equivalent to a placement in the x-direction. The third Zernike coefficient relates to the tilt of a measured wavefront in the y-direction. The tilt of a wavefront in the y-direction is equivalent to a placement in the y-direction. The fourth Zernike coefficient relates to a defocus of a measured wavefront. The fourth Zernike coefficient is equivalent to a placement in the z-direction. Higher order Zernike coefficients relate to other forms of aberration which are caused by the projection system (e.g. astigmatism, coma, spherical aberrations and other effects).

Throughout this description the term "aberrations" should be intended to include all forms of deviation of a wavefront from a perfect spherical wavefront. That is, the term "aberrations" may relate to the placement of an image (e.g. the second, third and fourth Zernike coefficients) and/or to higher order aberrations such as those which relate to Zernike coefficients having a Noll index of 5 or more.

Further information relating to the determination of aberrations which are caused by a projection system PL may be found, for example, in the reference "Full optical column characterization of DUV lithographic projection tools"; Mark A. van de Kerkhof, Wim de Boeij, Haico Kok, Marianna Silova, Jan Baselmans, Marcel Hemerik; *Proc. SPIE* 5377, Optical Microlithography XVII, 1960 (May 28, 2004); doi:10.1117/12.536331 which is herein incorporated by reference in its entirety.

The interference patterns which are measured at the radiation sensor 23 depend both on aberrations which are caused by the projection system PL and on the configuration and relative positioning of the measurement patterning device MA' and the sensor apparatus 21. Changes in the relative positioning of the patterned regions 15a-15c and detector regions 17a-17c will therefore affect the measurements which are made at the radiation sensor 23 and will affect the Zernike coefficients which are determined from the measurements. As was described above it is desirable to determine aberrations which are caused by the projection system PL such that the projection system PL can be adjusted according to the determined aberrations. If there are errors in the relative positioning of the measurement patterning device MA' and the sensor apparatus 21 then this will introduce errors in a determination of the aberrations which are caused by the projection system PL. This may in particular be the case for the determination of lower order Zernike coefficients, such as Zernike coefficients having a Noll index of 4 or less. As was described above the second, third and fourth Zernike coefficients relate to placement in the x, y and z-directions respectively. Errors in the placement of the measurement patterning device MA' and/or the sensor apparatus 21 may therefore, in particular, introduce errors in the determination of the second, third and fourth Zernike coefficients.

For example, if the measurements which are made by the radiation sensor 23 indicate an x or y-direction placement error in wavefronts which are received at the sensor apparatus 21 (which may affect the second and/or third Zernike coefficients) then this may be due to a placement error which is introduced by the projection system PL or may be due to a placement error of the sensor apparatus 21 and/or the measurement patterning device MA'. If the measurement patterning device MA' and the sensor apparatus 21 are perfectly positioned then a measurement of a placement error may be entirely attributed to the projection system PL. However any uncertainty in the placement of the measurement patterning device MA' and/or the sensor apparatus will translate into an uncertainty in the determination of the placement error which is introduced by the projection system PL.

Similarly, if the measurements which are made by the radiation sensor 23 indicate a z-direction placement error in wavefronts which are received at the sensor apparatus 21 (which may affect the fourth Zernike coefficient) then this may be due to the projection system PL or may be due to the relative positioning of the measurement patterning device MA' and/or the sensor apparatus 21 in the z-direction. An uncertainty in the positioning of the measurement patterning device MA' and/or the sensor apparatus 21 in the z-direction will therefore translate into an uncertainty in the determination of the focus of the projection system PL.

Typically the dependence of the x, y and z-direction placement aberrations (e.g. the second, third and fourth Zernike coefficients) on the relative positioning of the measurement patterning device MA' and/or the sensor apparatus 21 means that aberrations which are caused by the projection system PL and which relate to placement cannot be determined to a desired accuracy using the measurements which have been described above. In order to overcome this deficiency the aberrations which relate to placement (e.g. the lower order Zernike coefficients) are typically determined using an alternative aberration determination process which cannot be performed at the same time as the measurements which have been described above. Consequently multiple aberration determination processes may be performed in order to determine different aberrations which are caused by the projection system PL.

For example, the aberration determination process which was described above may be performed in order to determine aberrations which relate to higher order Zernike coefficients, such as Zernike coefficients having a Noll index of 5 or more. This may be referred to as a first determination process. The projection system PL may then be adjusted (e.g. using an adjustment means PA) so as to correct for the aberrations which were determined by the first determination process. Subsequently a second determination process (which is different to the first determination process) may be performed in order to determine placement aberrations in the x and y-directions (e.g. which relate to the second and third Zernike coefficients). The projection system PL may then be adjusted (e.g. using an adjustment means PA) so as to correct for the aberrations which were determined by the second determination process. Subsequently a third determination process (which is different to the first determination process) may be performed in order to determine placement aberrations in the z-direction (e.g. which relate to the fourth Zernike coefficient). The projection system PL may then be adjusted (e.g. using an adjustment means PA) so as to correct for the aberrations which were determined by the third determination process.

Using this process, the projection system PL may be adjusted for x, y and z-direction placement aberrations and aberrations which relate to Zernike coefficients up to approximately the $50^{th}$ order (or higher). However, adjustments of the projection system PL which are made in response to one of the determination processes may affect measurements which are made during one of the other determination processes. For example, adjustments of the projection system PL which are made in response to measurements made in the second and third determination processes may introduce aberrations which are measured during the first determination process, and which were previously adjusted for in response to the first determination process. Consequently the first determination process may have to be performed again in order to determine aberrations which were introduced by previous adjustments to the projection system PL. In order to fully adjust the projection system PL to a desired accuracy each determination process may be performed multiple times as part of an iterative calibration process.

An iterative calibration process during which multiple determination processes are performed multiple times may mean that the calibration process takes a relatively long time. For example, an iterative calibration process as has been described above may take approximately two days to perform. During this time the projection system PL and the lithographic apparatus cannot be used to pattern substrates (e.g. to manufacture integrated circuits). It is desirable to reduce the amount of time which it takes to perform a calibration process so as to reduce the amount of time during which a lithographic apparatus is offline and cannot be used to pattern substrates. In particular it may be desirable to determine aberrations which relate to placement (e.g. Zernike coefficients having a Noll index in the range of 2 to 4) and higher order (e.g. having a Noll index in the range of 5 to about 50) Zernike coefficients in a single determination process so as to circumvent the need to perform a time consuming iterative calibration process.

According to an embodiment of the invention the first determination process which was described above may be adapted so as to enable the determination of aberrations relating to both placement and higher order Zernike coefficients in a single determination process. In the determination process which was described above each detector region $25a$-$25c$ receives a single measurement beam $17a$-$17c$, where each measurement beam $25a$-$25c$ is transmitted at a single patterned region $15a$-$15c$. According to an embodiment of the invention, the configuration of the measurement system 10 may be changed so as to change the measurement beams $17a$-$17c$ which are received at the detector regions $25a$-$25c$. This may provide sufficient information to allow aberrations which relate to both placement (e.g. lower order Zernike coefficients) and higher order Zernike coefficients to be determined in a single determination process.

Figure 4A:
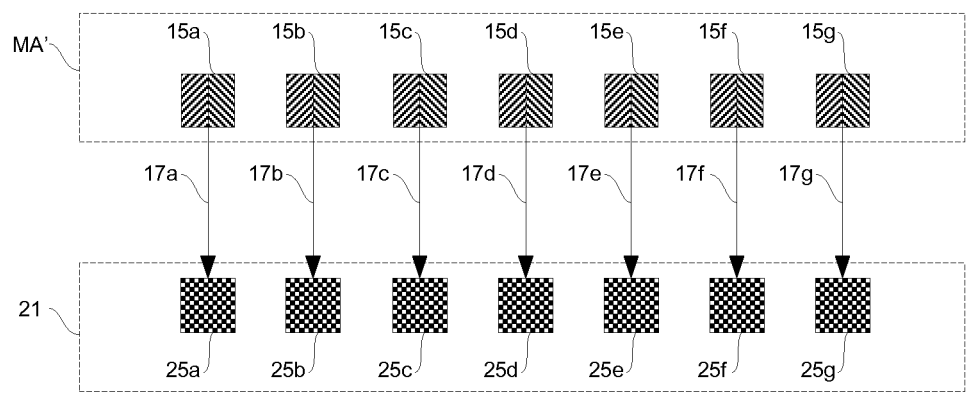
FIGS. 4A, 4B and 4C are schematic illustrations of relative configurations of a patterning device and a sensor apparatus.
Figure 4B:
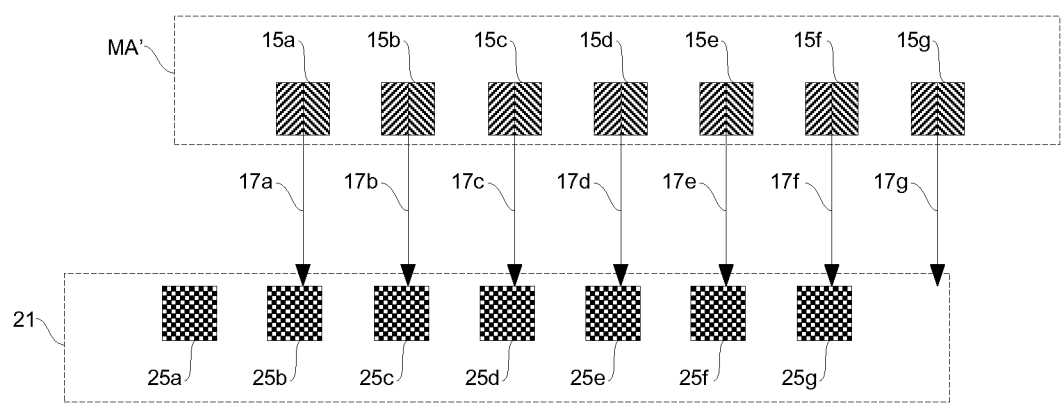
Figure 4C:
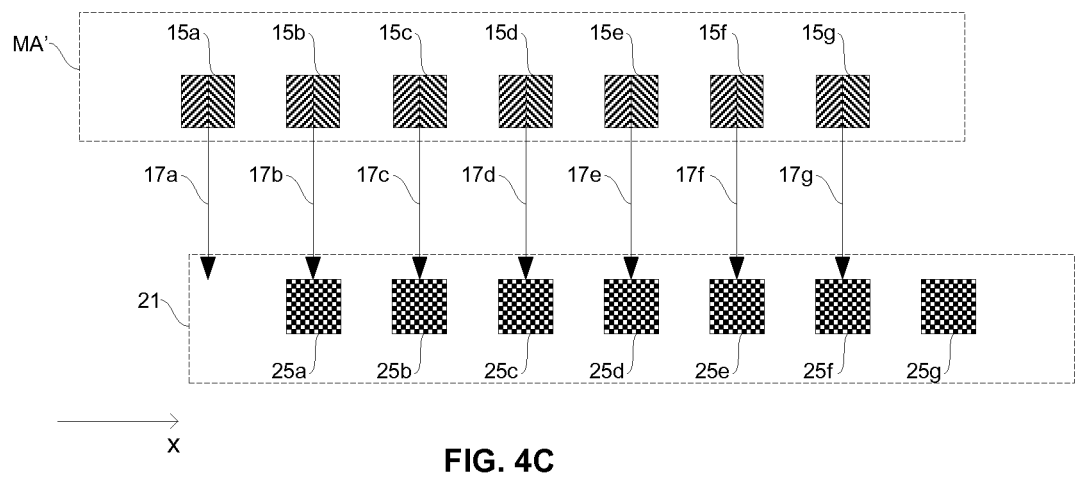

FIGS. 4A-4C are representations of stages of a method of determining aberrations caused by a projection system PL according to an embodiment of the invention. In the embodiment which is represented in FIGS. 4A-4C a measurement patterning device MA' comprises seven patterned regions $15a$-$15g$. As was described above with reference to FIG. 3A each of the patterned regions $15a$-$15g$ include first and second portions which comprise diffraction gratings aligned with the u and v-directions. For ease of illustration, the first and second portions of the patterned regions $15a$-$15g$ are not labelled separately in FIGS. 4A-4C. Seven measurement beams $17a$-$17g$ are formed and a sensor apparatus 21 comprises seven detector regions $25a$-$25g$. FIG. 4A is a schematic representation of the correspondence between the patterned regions $15a$-$15g$, the measurement beams $17a$-$17g$ and the detector regions $25a$-$25g$ during a first stage of a method of determining aberrations caused by a projection system PL. FIG. 4B is a schematic representation of the correspondence between the patterned regions $15a$-$15g$, the measurement beams $17a$-$17g$ and the detector regions $25a$-$25g$ during a second stage of the method. FIG. 4C is a schematic representation of the correspondence between the patterned regions $15a$-$15g$, the measurement beams $17a$-$17g$ and the detector regions $25a$-$25g$ during a third stage of the method.

In the illustrations which are shown in FIGS. 4A-4C the measurement patterning device MA' and the sensor apparatus 21 are displayed relative to the same co-ordinate system. As was described above, in some embodiments the co-ordinate system may be transformed by the projection system PL.

During the first, second and third stages of the method which is represented in FIGS. 4A-4C, each measurement beam $17a$-$17g$ is modified at a corresponding patterned region $15a$-$15g$. During the first stage of the method (as shown in FIG. 4A) the measurement patterning device MA' and the sensor apparatus 21 are in a first relative configuration in which each modified measurement beam $17a$-$17g$ is received at a corresponding detector region $25a$-$25g$.

Whilst the measurement patterning device MA' and the sensor apparatus 21 are in the first relative configuration, a first measurement is made by the sensor apparatus 21. The first measurement may comprise a single measurement or may comprise multiple measurements. For example, as was described above with reference to FIGS. 2, 3A and 3B the patterned regions $15a$-$15g$ and/or the detector regions $25a$-$25g$ may be scanned relative to each other in one or more directions (e.g. two perpendicular directions) whilst measurements are made by a radiation sensor 23 which forms part of the sensor apparatus 21. The measurement patterning device MA' and the sensor apparatus 21 may still be considered to be in the first relative configuration even during scanning of the patterned regions $15a$-$15g$ and/or the detector regions $25a$-$25g$ as long as the correspondence between patterned regions $15a$-$15g$, measurement beams $17a$-$17g$ and detector regions $25a$-$25g$ remains as depicted in FIG. 4A. A series of measurements which are performed during scanning of the patterned regions $15a$-$15g$ and/or the detector regions $25a$-$25g$ whilst the measurement patterning device MA' and the sensor apparatus 21 are in the first relative configuration may be considered to form a first measurement.

During the second stage of the method (as shown in FIG. 4B) the measurement patterning device MA' and the sensor apparatus 21 are in a second relative configuration. In the second relative configuration, some of the detector regions $25a$-$25g$ receive a different measurement beam $17a$-$17g$ to the measurement beam which was received at the respective detector region $25a$-$25g$ when the measurement patterning device MA' and the sensor apparatus 21 were positioned in the first relative configuration. For example, in the first relative configuration (as shown in FIG. 4A) a second detector region 25b receives a second measurement beam 17b, whereas in the second relative configuration (as shown in FIG. 4B) the second detector region 25b receives a first measurement beam 17a (which was received by a first detector region 25a in the first relative configuration).

Whilst the measurement patterning device MA' and the sensor apparatus 21 are in the second relative configuration, a second measurement is made by the sensor apparatus 21. Similarly to the first measurement, the second measurement may comprise a single measurement or may comprise multiple measurements. For example, the second measurement may comprise a series of measurements which are made whilst the patterned regions 15a-15g and/or the detector regions 25a-25g are scanned relative to each other in one or more directions (e.g. two perpendicular directions).

During the third stage of the method (as shown in FIG. 4C) the measurement patterning device MA' and the sensor apparatus 21 are in a third relative configuration. In the third relative configuration, some of the detector regions 25a-25g receive a different measurement beam 17a-17g to the measurement beam which was received at the respective detector region 25a-25g when the measurement patterning device MA' and the sensor apparatus 21 were positioned in the first relative configuration and in the second relative configuration.

Whilst the measurement patterning device MA' and the sensor apparatus 21 are in the third relative configuration, a third measurement is made by the sensor apparatus 21. Similarly to the first and second measurements, the third measurement may comprise a single measurement or may comprise multiple measurements. For example, the third measurement may comprise a series of measurements which are made whilst the patterned regions 15a-15g and/or the detector regions 25a-25g are scanned relative to each other in one or more directions (e.g. two perpendicular directions).

The measurement patterning device MA' and the sensor apparatus 21 may, for example, be transitioned between the first relative configuration, the second relative configuration and the third relative configuration by moving the sensor apparatus 21 relative to the measurement patterning device MA' and the measurement beams 17a-17g. For example, the sensor apparatus 21 may be moved in the positive and/or negative x-directions relative to the patterned regions 15a-15g and the measurement beams 17a-17g. The sensor apparatus may be moved by the positioning apparatus PW which is shown schematically in FIG. 2.

In the embodiment which is shown in FIGS. 4A-4C the patterned regions 15a-15g are uniformly spaced apart in the x-direction. That is, the separation (in the x-direction) between adjacent patterned regions 15a-15g is the same for each of the patterned regions 15a-15g. Similarly the detector regions 25a-25g are uniformly spaced apart in the x-direction. In order to transition the measurement patterning device MA' and the sensor apparatus 21 from the first relative configuration to the second relative configuration the sensor apparatus is shifted in the negative x-direction by a distance which is approximately equal to the separation between adjacent detector regions 25a-25g. In order to transition the measurement patterning device MA' and the sensor apparatus 21 from the first relative configuration to the second relative configuration the sensor apparatus is shifted in the positive x-direction by a distance which is approximately equal to the separation between adjacent detector regions 25a-25g. Accordingly the shift between the first relative configuration and the second relative configuration may be referred to as an x-shift of −1. The shift between the first relative configuration and the second relative configuration may be referred to as an x-shift of +1.

As can be seen in FIGS. 4B and 4C movement of the sensor apparatus 21 relative to the measurement patterning device MA' may result in at least one of the detector regions 25a-25g not receiving a measurement beam 17a-17g and at least one of the measurement beams 17a-17g not being received at a detector region 25a-25g. For example, in the second relative configuration (as shown in FIG. 4B) the first detector region 25a does not receive a measurement beam 17a-17g and a seventh measurement beam 17g is not received at a detector region 25a-25g. In the third relative configuration (as shown in FIG. 4C) a seventh detector region 25g does not receive a measurement beam 17a-17g and the first measurement beam 17a is not received at a detector region 25a-25g.

Each of the first, second and third measurements may be considered to comprise a series of sub-measurements, where each sub-measurement comprises at least one measurement of a given measurement beam 17a-17g at a given detector region 25a-25g. For example, the first measurement is made in the first relative configuration when each of the seven detector regions 25a-25g receives a corresponding measurement beam 17a-17g. The first measurement therefore comprises seven sub-measurements where each sub-measurement comprises one or more measurements of a given measurement beam 17a-17g at a given detector region 25a-25g. The second and third measurements are made in the second and third relative configurations. In each of the second and third relative configurations, six out of the seven measurement beams 17a-17g are received at one of the detector regions 25a-25g. The second and third measurements therefore each comprise six sub-measurements where each sub-measurement comprises one or more measurements of a given measurement beam 17a-17g at a given detector region 25a-25g.

Making the first, second and third measurements whilst the measurement patterning device MA' and the sensor apparatus 21 are in the first, second and third relative configurations results in at least some of the measurement beams 17a-17g being received and measured at a plurality of detector regions 25a-25g. For example, the second measurement beam 17b is received at the second detector region 25b in the first relative configuration, a third detector region 25c in the second relative configuration and the first detector region 25a in the third relative configuration.

Measuring a measurement beam multiple times at a plurality of detector regions may provide more information about the measurement beam (when compared to only measuring a measurement beam being received at a single detector region 25a-25g). In particular measuring a measurement beam multiple times at a plurality of detector regions may provide information about the measurement beam which is less dependent on the positioning, orientation and configuration of the sensor apparatus 21. As will be described in further detail below, measuring a measurement beam multiple times and being received at a plurality of detector regions may allow aberrations which are caused by the projection system PL to be separated from aberrations which are a result of errors in the positioning and/or the configuration of the sensor apparatus 21. This advantageously allows aberrations caused by the projection system PL and which relate to lower order Zernike coefficients (in addition to aberrations which relate to higher order Zernike coefficients) to be determined from the method which is represented in FIGS. 4A-4C.

In some embodiments the measurement patterning device MA' and the sensor apparatus 21 may be arranged in more than three relative configurations. For example, the sensor apparatus 21 may be further shifted in the x-direction such that the measurement patterning device MA' and the sensor apparatus 21 are arranged in other relative configurations. The sensor apparatus 21 may be shifted from the first relative configuration by distances which are greater than the x-separation between adjacent detector regions. For example, the sensor apparatus 21 may be shifted from the first relative configuration by a distance which is approximately equal to twice the x-separation between adjacent detector regions. Such a shift may be referred to as a +2 x-shift when the shift is in the positive x-direction and a −2 x-shift when the shift is in the negative x-direction. In general a relative shift from the first relative configuration by a distance which is approximately equal to plus or minus n times the separation between adjacent detector regions may be referred to as a plus or minus n shift.

In an embodiment, the sensor apparatus 21 may be moved between a −4 x-shift and a +4 x-shift (including all shift positions in between). In each position a measurement is made by the sensor apparatus 21, where each measurement comprises at least one sub-measurement. The number of sub-measurements which are made at each shift position depends on how many of the detector regions 25a-25g receive a measurement beam 17a-17g in each shift position.

Figure 5A:
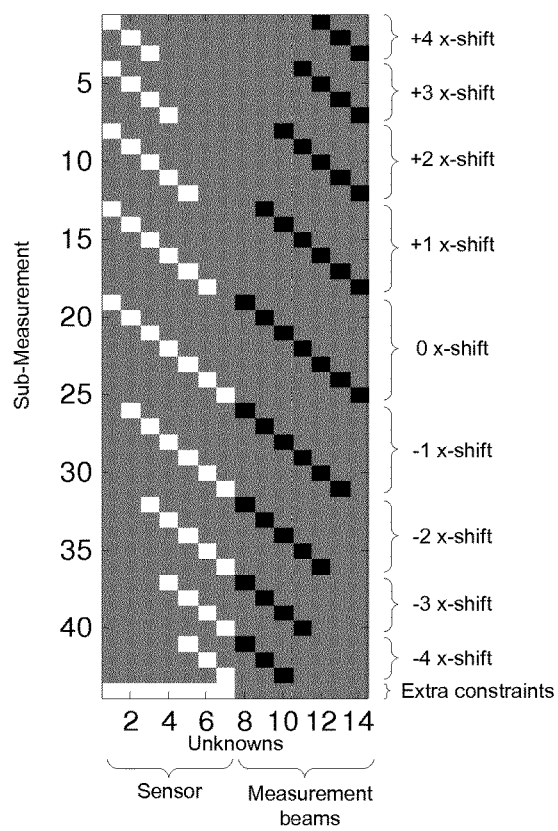
FIGS. 5A, 5B and 5C are schematic representations of design matrices which may be used to determine aberrations caused by a projection system according to an embodiment of the invention.

FIG. 5A is a schematic representation of the information which is obtained by the measurements which are described above. The representation which is shown in FIG. 5A may be referred to as a design matrix. Each row of the design matrix represents a sub-measurement and each column of the design matrix represents information relating to an unknown variable of the measurement system.

The unknown variables of the measurement system relate to properties of the sensor apparatus 21, the measurement patterning device MA' and the projection system PL. As will be described below the sub-measurements which are represented in the design matrix of FIG. 5A allow the unknown variables which relate to the sensor apparatus to be separated from the unknown variables which relate to the measurement patterning device MA' and the projection system PL. The unknown variables are therefore represented in FIG. 5A as 14 columns where each column relates an unknown. The first 7 columns in FIG. 5A each relate to an unknown which is associated with one of the seven detector regions 25a-25g of the sensor apparatus 21. The second 7 columns in FIG. 5A each relate to an unknown which is associated with one of the seven measurement beams 17a-17g. Unknowns which are associated with the measurement beams 17a-17g may relate to unknown variables of the measurement patterning device MA' and/or unknown variables of the projection system PL.

As is indicated in FIG. 5A the first three rows of the design matrix relate to sub-measurements which are made when the sensor apparatus 21 is in a +4 x-shift position. In the +4 x-shift position three of the measurement beams 17a-17g are received at three of the detector regions 25a-25g. Three sub-measurements are therefore made when the sensor apparatus 21 is in the +4 x-shift position and hence the first three rows of the design matrix relate to the sensor apparatus 21 in the +4 x-shift position.

As can be seen from FIG. 5A, the next four rows of the design matrix relate to four sub-measurements which are made when the sensor apparatus 21 is in a +3 x-shift position, the next five rows relate to five sub-measurement which are made when the sensor apparatus 21 is in a +2 x-shift position and so on. When the sensor apparatus is in a 0 x-shift position all seven measurement beams 17a-17g are received at a respective detector region 25a-25g. Seven sub-measurements are therefore made when the sensor apparatus 21 is in the 0 x-shift position and accordingly seven rows of the design matrix relate to the 0 x-shift position.

Each sub-measurement (and hence each row of the design matrix) relates to the measurement of a single measurement beam 17a-17g at a single detector region. Each row of the design matrix therefore contains information which is related to an unknown associated with a single detector region 25a-25g and information which is related to an unknown associated with a single measurement beam 17a-17g. Accordingly each row of the design matrix contains two non-zero values. Non-zero values which are associated with a detector region 25a-25g are represented in FIG. 5A with white shaded regions. Non-zero values which are associated with a measurement beam 17a-17g are represented in FIG. 5A with black shaded regions. Zero values are represented in FIG. 5A with grey shaded regions. Grey shaded regions denote unknowns about which a given sub-measurement does not provide any information.

The design matrix which is shown in FIG. 5A may equivalently be thought of as a series of equations, where each row of the design matrix relates to a single equation. The equations may be solved simultaneously so as to find the unknowns which relate to the sensor apparatus 21 and the measurement beams. Finding the unknowns may allow aberrations which are caused by the projection system PL to be determined. By separately finding the unknowns which are associated with the sensor apparatus 21, the influence of uncertainties associated with the sensor apparatus 21 on the determination of the aberrations which are caused by the projection system may be advantageously reduced.

In the example, which is shown in FIG. 5A there are more equations than there are unknowns. This may allow the unknowns to be found from the equations. However the equations may be under constrained and therefore extra constraints may need to be added to the design matrix in order to solve for the unknowns. This is represented in FIG. 5A with an extra row at the bottom of the design matrix. The extra constraints may relate to a physical assumption which is made about the measurement system. For example, in one embodiment it may be assumed that the sum of the offsets of the detector regions 25a-25g from their presumed positions is equal to zero. This assumption may be added to the design matrix by adding the following equation:

$$\Sigma_k d_k = 0 \qquad (1)$$

where k is an index which denotes the detector regions 25a-25g and $d_k$ is the offset of the $k_{th}$ detector region. This assumption is shown in the bottom row of the design matrix which is shown in FIG. 5A in which the elements relating to the sensor apparatus unknowns have non-zero values.

Adding the extra constraint that the average offset of the detector regions 25a-25g from their presumed positions is equal to zero may allow the equations to be solved and the aberrations which are caused by the projection system PL to be determined. In other embodiments different and/or additional physical assumptions may be added to the design matrix in order to solve the equations and determine aberrations which are caused by the projection system PL.

In the design matrix which is represented in FIG. 5A, the only unknowns which are included relate to the sensor apparatus 21 and the measurement beams 17a-17g. These unknowns are presumed to be the same during each relative configuration of the sensor apparatus 21 and the measurement patterning device MA'. That is, at each shift position of the sensor apparatus 21 and at each row of the design matrix the unknowns are assumed to be the same. Such a formulation of the design matrix effectively assumes that no errors are made in the shifting of the sensor apparatus 21 between shift positions and that any uncertainties associated with the sensor apparatus 21 are constant and equal at each shift position. As will be described below, this may be a reasonable assumption to make for the purposes of determining some aberrations which are caused by the projection system PL but not for determining other aberrations which are caused by the projection system PL.

Aberrations which relate to higher order Zernike coefficients (e.g. having a Noll index in the range of 5 to about 50) relate to forms of aberration which are likely to be caused by optical elements which form the projection system and are not likely to be caused by the measurement patterning device MA' and/or the sensor apparatus 21. For example, higher order Zernike coefficients may relate to effects such as astigmatism, coma and/or spherical aberrations. In particular, uncertainties in the shifting of the sensor apparatus 21 are unlikely to introduce aberrations such as astigmatism, coma and/or spherical aberrations into measurements made by the sensor apparatus 21. Uncertainties in the shifting of the sensor apparatus 21 may not therefore affect the determination of higher order Zernike coefficients. An assumption that no errors are made in the shifting of the sensor apparatus 21 between shift positions may therefore be a reasonable assumption to make when determining higher order Zernike coefficients since accounting for shift uncertainties may not affect the determination of higher order Zernike coefficients. The design matrix which is shown in FIG. 5A may therefore be suitable for determining aberrations which relate to higher order Zernike coefficients (e.g. having a Noll index in the range of 5 to about 50).

The determination of lower order Zernike coefficients (e.g. having a Noll index which is less than about 5) may be affected by uncertainties in the shifting of the sensor apparatus 21. As was described above, lower order Zernike coefficients relate to aberrations such as placement and focus. Errors in the shifting of the sensor apparatus 21 between shift positions may introduce placement and focus aberrations into the measurements made by the sensor apparatus 21 and thus uncertainties in the shifting of the sensor apparatus 21 may affect the determination of lower order Zernike coefficients. Accordingly, it may not be reasonable, for the purposes of determining lower order coefficients, to assume that no errors are made in the shifting of the sensor apparatus 21 between different shift positions.

Figure 5B:
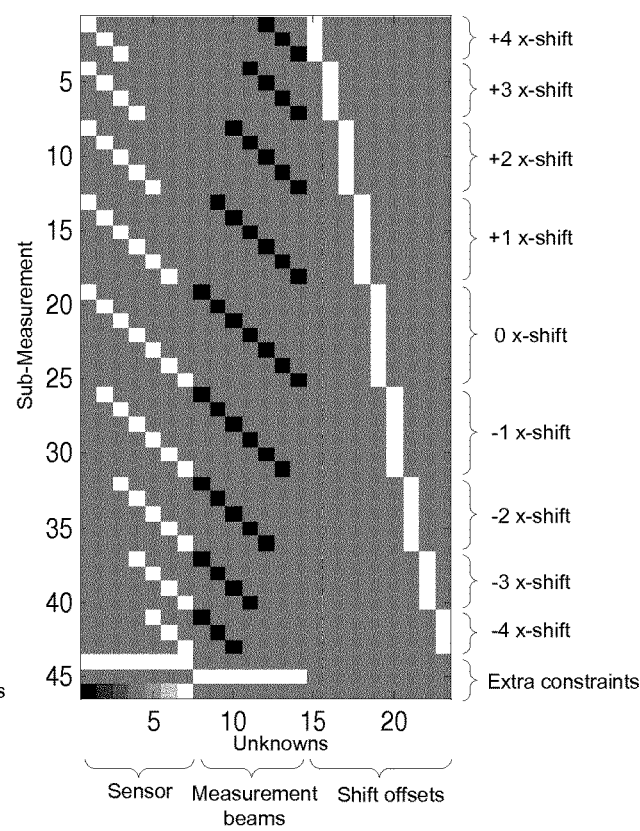

Errors in the shifting of the sensor apparatus 21 between shift positions may be accounted for by introducing further unknowns to the design matrix. FIG. 5B is a schematic representation of a design matrix in which further unknowns have been included. The further unknowns are shown in FIG. 5B as extra columns added to the right hand side of the design matrix. In the embodiment which is shown in FIG. 5B the further unknowns relate to offsets in the shift of the sensor apparatus 21 between different shift positions. Each shift position of the sensor apparatus 21 has an associated unknown related to the shift offset of the sensor apparatus 21 at that shift position. Therefore, for each shift position an extra unknown column is added to the design matrix.

At each shift position of the sensor apparatus 21, the sub-measurements which are made at that shift position contain information related to the shift offset of the sensor apparatus 21 at that shift position. For example, the three sub-measurements which are made at the +4 x-shift position each contain information related to the shift offset of the sensor apparatus 21 at the +4 shift position. This can be seen in FIG. 5B since the first shift offset column of the design matrix (which relates to the shift offset of the sensor apparatus 21 at the +4 shift position) contains non-zero values in the top three rows which relate to the sub-measurements which are made in the +4 shift position.

Since the design matrix which is shown in FIG. 5B contains extra unknowns (when compared with the design matrix which is shown in FIG. 5A) further extra constraints may need to be added to the design matrix in order to solve for all of the unknowns. This is shown in FIG. 5B with two extra rows which are added to the bottom of the design matrix when compared with the design matrix which is shown in FIG. 5A. The two extra rows relate to further physical assumptions which are made about the measurement system. The design matrix of FIG. 5B contains the assumptions that the sum of the offsets of the detector regions 25a-25g from their presumed positions is equal to zero (first row of extra constraints), that the sum of the offsets of the patterned regions 15a-15g from their presumed positions is equal to zero (second row of extra constraints) and that the sensor apparatus 21 no magnification is introduced by shifting the sensor apparatus 21 in the x-direction (third row of extra constraints).

The assumption that the sum of the offsets of the detector regions 25a-25g from their presumed positions is equal to zero may be added to the design matrix in the form of equation (1). The assumption that the sum of the offsets of the patterned regions 15a-15g from their presumed positions is equal to zero may be added to the design matrix by adding the following equation:

$$\Sigma_l p_l = 0 \quad (2)$$

where l is an index which denotes the patterned regions 15a-15g and $p_l$ is the offset of the $l_{th}$ patterned region. The assumption that no magnification is introduced by shifting the sensor apparatus 21 in the x-direction may be added to the design matrix by adding the following equation:

$$\Sigma_k x d_k = 0 \quad (3)$$

where x is a position on the x-axis of the detector regions 25a-25g. When this assumption is applied to the calculation of the second Zernike coefficient it is equivalent to assuming that the magnification of the sensor apparatus 21 is equal to a desired (or design) magnification.

The addition of equations (1), (2) and (3) to the design matrix may allow aberrations which are caused by the projection system PL to be determined whilst accounting for uncertainties related to offsets in the shift of the sensor apparatus 21 between shift positions. The design matrix which is shown in FIG. 5B may, for example, be used to determine one or more lower order Zernike coefficients (e.g. having a Noll index of 4 or less). The design matrix which is shown in FIG. 5B may, for example, be used to determine the second Zernike coefficients for each measurement beam 17a-17g.

As was described above, the design matrix which is shown in FIG. 5B includes extra unknowns which relate to the offsets in the shift of the sensor apparatus 21 between shift positions and thus uncertainties in the shift offsets are accounted for. This approach assumes that the only uncertainties which are associated with the shifting of the sensor apparatus 21 relate to offsets in the shifting. The design matrix of FIG. 5B therefore includes an assumption that no rotation of the sensor apparatus 21 occurs in the shifting. For example, the design matrix of FIG. 5B assumes that no rotation of the sensor apparatus 21 about the y or the z-axis occurs. This assumption may be a reasonable assumption to make when determining the second Zernike coefficients relating to each measurement beam 17a-17g since rotations of the sensor apparatus 21 about the y and/or the z-axis are unlikely to affect the determination of the second Zernike coefficients. The second Zernike coefficient relates to a placement of a measured wavefront in the x-direction. Rotation of the sensor apparatus 21 about the y and/or the z-axis are unlikely to introduce a magnification to the measurements made by the sensor apparatus 21. Not accounting for such rotations in the sensor apparatus 21 may therefore be a reasonable assumption to make when determining the second Zernike coefficients.

As was described above the third Zernike coefficient relates to the placement of a measured wavefront in the y-direction and the fourth Zernike coefficient relates to a focus of a measured wavefront or equivalently to the placement in the z-direction of a measured wavefront. A rotation of the sensor apparatus 21 which occurs during shifting of the sensor apparatus 21 may introduce a placement error in the y-direction and/or may change the focus of radiation which is measured by the sensor apparatus 21. Rotation of the sensor apparatus 21 may therefore affect a determination of the third and/or fourth Zernike coefficients. In order to determine aberrations which are caused by the projection system PL and which relate to the third and fourth Zernike coefficients, uncertainties in the tilt of the sensor apparatus which occur during shifting of the sensor apparatus 21 may therefore be included as extra unknowns in the design matrix.

Figure 5C:
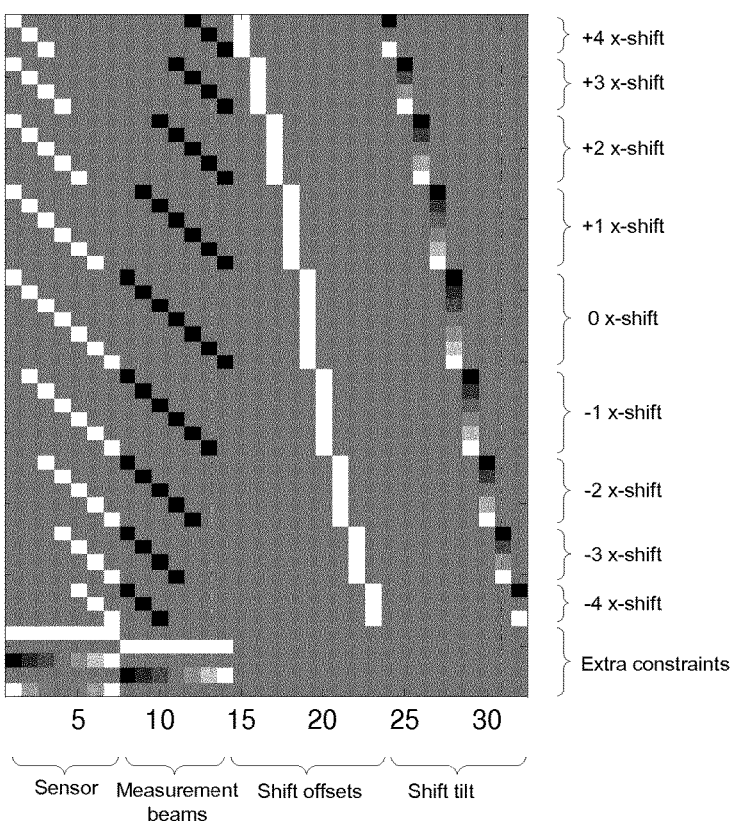

FIG. 5C is a schematic representation of a design matrix which may be used to determine third and/or fourth Zernike coefficients. The design matrix which is shown in FIG. 5C includes extra columns (when compared to the design matrix of FIG. 5B) which relate to unknowns associated with the tilt of the sensor apparatus which occurs during shifting of the sensor apparatus 21. Each shift position of the sensor apparatus 21 has an associated unknown related to the tilt of the sensor apparatus 21 at that shift position. Therefore, for each shift position an extra unknown column is added to the design matrix.

At each shift position of the sensor apparatus 21, the sub-measurements which are made at that shift position contain information related to the tilt of the sensor apparatus 21 at that shift position. For example, the three sub-measurements which are made at the +4 x-shift position each contain information related to the tilt of the sensor apparatus 21 at the +4 shift position. This can be seen in FIG. 5C since the first shift tilt column of the design matrix (which relates to the tilt of the sensor apparatus 21 at the +4 shift position) contains non-zero values in rows which relate to the sub-measurements which are made in the +4 shift position. The sub-measurements which are made in each shift position each provide different information about the tilt of the sensor apparatus 21 in that shift position. This can be seen in FIG. 5C by the different values which appear in each shift tilt column at a given shift position.

Since the design matrix which is shown in FIG. 5C contains extra unknowns (when compared with the design matrix which is shown in FIG. 5B) further extra constraints may need to be added to the design matrix in order to solve for all of the unknowns. This is shown in FIG. 5C with two extra rows which are added to the bottom of the design matrix when compared with the design matrix which is shown in FIG. 5B. The two extra rows relate to further physical assumptions which are made about the measurement system. The design matrix of FIG. 5C contains the assumptions that the sum of the offsets of the detector regions 25a-25g from their presumed positions is equal to zero (first row of extra constraints), that the sum of the offsets of the patterned regions 15a-15g from their presumed positions is equal to zero (second row of extra constraints), no magnification is introduced by shifting the sensor apparatus 21 in the x-direction (third row of extra constraints), that the measurement patterning device MA' is not tilted in the x-direction (fourth row of extra constraints) and that the sensor apparatus 21 does not include any curvature (fifth row of extra constraints).

The first three constraints (which were also included in the design matrix which is shown in FIG. 5B) may be added to the design matrix in the form of equations (1), (2) and (3) as was described above. The assumption that the measurement patterning device is not tilted in the x-direction may be added to the design matrix by adding the following equation:

$$\Sigma_l x p_l = 0 \quad (4)$$

where l is an index which denotes the patterned regions 15a-15g, $p_l$ is the offset of the $l_{th}$ patterned region and x is a position on the x-axis of the patterned regions 15a-15g. The assumption that the sensor apparatus 21 does not include any curvature may be added to the design matrix by adding the following equation:

$$\Sigma_k x^2 d_k = 0 \quad (5)$$

where the variables in equation (5) are the same as was described above with reference to equation (3).

The addition of the extra constraints to the design matrix may allow aberrations which are caused by the projection system PL to be determined whilst accounting for uncertainties related to offsets in the shift of the sensor apparatus 21 between shift positions and for uncertainties related to tilt of the sensor apparatus 21 which occurs during shifting of the sensor apparatus 21 between shift positions. The design matrix which is shown in FIG. 5C may, for example, be used to determine one or more lower order Zernike coefficients (e.g. having a Noll index of 4 or less). The design matrix which is shown in FIG. 5C may, for example, be used to determine the third and/or the fourth Zernike coefficients for each measurement beam 17a-17g.

Some or all of the physical assumptions which are made in order to add the extra constraints to the design matrix of FIG. 5C are reasonable assumptions to make. For example, the position and/or tilt of the sensor apparatus in the x-direction may be closely controlled and calibrated and thus the assumptions of equations (1)-(4) may hold true to a reasonable accuracy. However, in some embodiments it may be desirable to not include the assumption that the sensor apparatus 21 does not include any curvature (equation (5)). In some embodiments the sensor apparatus 21 may include some curvature. For example, regions of the sensor apparatus 21 may be heated locally which may introduce curvature to the sensor apparatus 21. If the sensor apparatus 21 is assumed to include no curvature then the determination of aberrations which are caused by the projection system PL may be affected by curvature of the sensor apparatus 21 thereby introducing uncertainties in the determination of aberrations. In some embodiments, it may therefore be desirable to determine aberrations which are caused by the projection system PL whilst accounting for any curvature of the sensor apparatus 21. In particular it may be desirable to provide a method which enables the curvature of the sensor apparatus 21 to be determined whilst simultaneously determining aberrations which are caused by the projection system PL.

Embodiments have been described above in which patterned regions 15*a*-15*g* of a measurement patterning device MA' are spaced apart in the x-direction, detector regions 25*a*-25*g* of a sensor apparatus 21 are spaced apart in the x-direction and the sensor apparatus 21 is shifted relative to the measurement patterning device MA' in the x-direction. In some embodiments, a measurement patterning device MA' may include patterned regions which are also spaced apart in the y-direction. A sensor apparatus may include detector regions which are additionally or alternatively spaced apart in the y-direction and the sensor apparatus 21 may be shifted relative to the measurement patterning device MA' in both the x and y-directions. The spacing between detector regions in the y-direction may be the same as the spacing between detector regions in the x-direction or may be different to the spacing between detector regions in the x-direction.

Figure 6A:
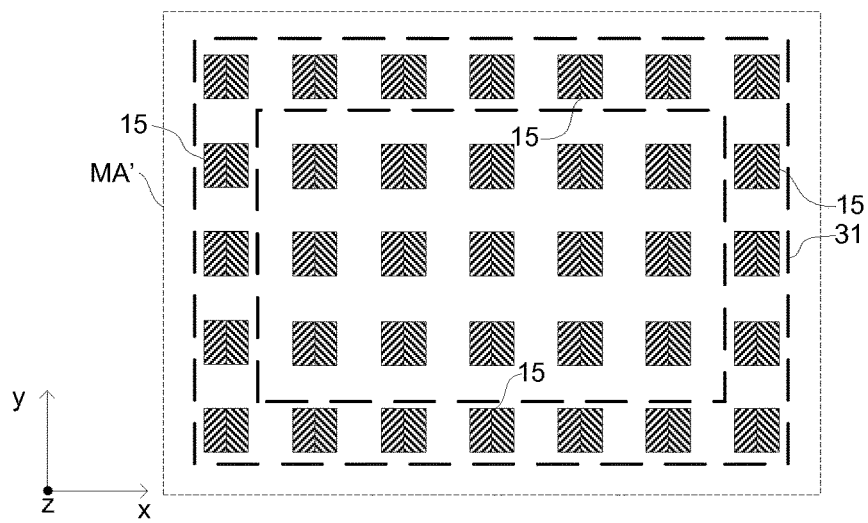
FIGS. 6A, 6B and 6C are schematic illustrations of a patterning device, a sensor apparatus and different relative configurations of the patterning device and the sensor apparatus.
Figure 6B:
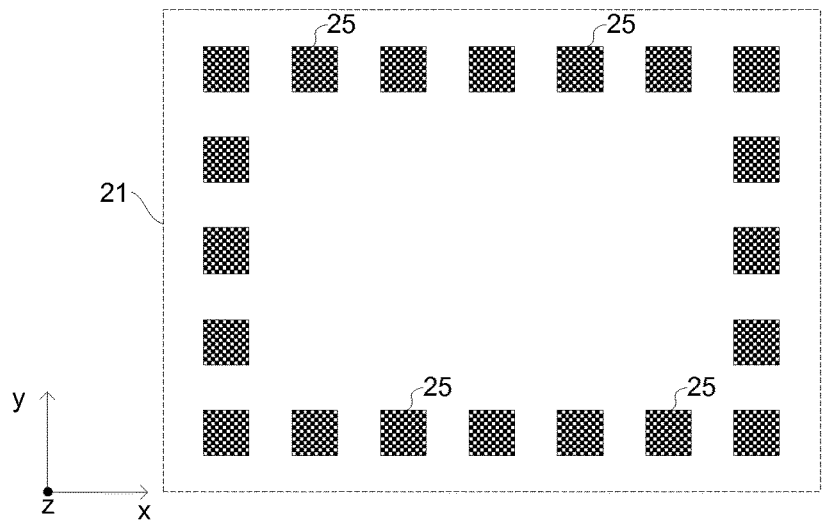
Figure 6C:
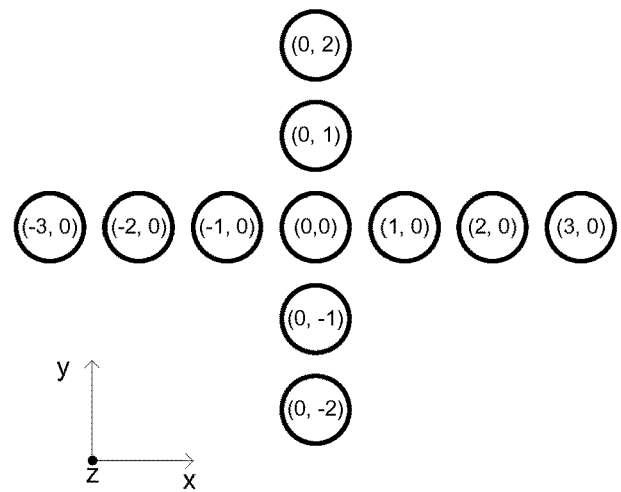

FIG. 6A is a schematic illustration of a measurement patterning device MA' which includes a plurality of patterned regions 15 which are spaced apart in both the x and the y-directions. FIG. 6B is a schematic illustration of a sensor apparatus 21 which includes a plurality of detector regions 25 which are spaced apart in both the x and y-directions. FIG. 6C is a schematic illustration of a plurality of shift positions of the sensor apparatus 21 of FIG. 6B relative to the measurement patterning device MA' of FIG. 6A.

In the embodiment which is shown in FIG. 6A, the measurement patterning device MA' comprises thirty five patterned regions 15. Each of the patterned regions 15 may be illuminated simultaneously such that thirty five measurement beams propagate through the projection system PL. The projection system PL forms an image of the measurement beams at the sensor apparatus 21. The sensor apparatus 21 which is shown in FIG. 6B comprises twenty one detector regions 25. Since there are fewer detector regions 25 than measurement beams, only some of the measurement beams are received at a detector region 25 in a given relative configuration of the measurement patterning device MA' and the sensor apparatus 21.

FIG. 6C illustrates different positions of the sensor apparatus 21 relative to the measurement patterning device MA'. Each position is labelled with a relative position in the form (x, y) where x denotes an x-shift of the sensor apparatus 21 relative to a central position and y denotes a y-shift of the sensor apparatus 21 relative to the central position. The central position is labelled with the relative position (0,0). The central position of the sensor apparatus 21 relative to the measurement patterning device MA' represents a relative configuration of the measurement patterning device MA' and the sensor apparatus 21 in which measurement beams originating from the outermost patterned regions 15 of the measurement patterning device MA' are received at the detector regions 25. The outermost patterned regions 15 are denoted in FIG. 6A with a dashed box labelled 31.

As is shown in FIG. 6C the sensor apparatus 21 is shifted in the positive and negative x-directions relative to the central position (0,0). The sensor apparatus 21 is further shifted in the positive and negative y-directions relative to the central position (0,0). In each relative position of the sensor apparatus 21 some of the detector regions 25 receive a measurement beam and at least one measurement of the measurement beams are made by the sensor apparatus. The at least one measurement comprises a plurality of sub-measurements where each sub-measurement comprises at least one measurement of a given measurement beam which is incident on a given detector region 25.

By shifting the sensor apparatus 21 to the different shift positions which are shown in FIG. 6C each measurement beam is measured at more than one x-position on the sensor apparatus 21 and at more than one y-position on the sensor apparatus 21. Measuring each measurement beam at a plurality of different x-positions and at a plurality of different y-positions on the sensor apparatus 21 may provide more information than just measuring a measurement beam at a plurality of different x-positions (as was described above with reference to FIGS. 5A-5C). In particular measuring each measurement beam at a plurality of different x-positions and at a plurality of different y-positions on the sensor apparatus 21 may allow any curvature of the sensor apparatus 21 to be accounted for.

The sensor apparatus 21 is considered to be a rigid body which does not deform when shifted in the x and/or the y-directions. However, the sensor apparatus 21 may rotate when the sensor apparatus 21 is shifted in the x and/or the y-directions. Any rotation of the sensor apparatus 21 about the z-axis when the sensor apparatus is shifted in the x and/or the y directions will influence measurements made both at different x-shift positions and different y-shift positions. Information about the rotation of the sensor apparatus 21 about the z-axis is therefore repeated in measurements made at different x-shift positions and in measurement made at different y-shift positions. Combining measurements which are made at different x-shift and different y-shift positions in a single design matrix therefore allows rotation of the sensor apparatus 21 about the z-axis to be accounted for without adding the rotation as an unknown. Combining measurement which are made at different x-shift positions and different y-shift positions therefore allows less unknowns to be added to the design matrix. Consequently fewer extra constraints may be added to the design matrix in order to solve for the unknowns. In particular, only extra constraints in the form of linear equations (and not quadratic equations) may be added to the design matrix. For example, equation (5) which relates to the curvature of the sensor apparatus 21 may not be added to the design matrix. Shifting of the sensor apparatus 21 in both the x and y-directions therefore advantageously allows aberrations which are caused by the projection system PL to be derived whilst accounting for any curvature of the sensor apparatus 21.

The measurements which are made by the sensor apparatus 21 at the different shift positions shown in FIG. 6C may be combined in a design matrix in an analogous manner as was described above with reference to FIGS. 5A-C. For example, extra unknowns and extra constraints may be added to a design matrix in order to determine aberrations which are caused by the projection system PL for each of the measurement beams. The unknowns and constraints which are added in order to determine aberrations may be different for the determination of different Zernike coefficients. For example, for higher order Zernike coefficients (e.g. Zernike coefficients having a Noll index of 5 or more) no extra unknowns may added to the design matrix and only constraints related to the sum of the offsets of the detector regions 25 may added to the design matrix. For lower order Zernike coefficients (e.g. the second, third and fourth Zernike coefficients) one or more further unknowns and further constraints may be added to the design matrix. As was described above by measuring the measurement beams at a plurality of different x and y-positions on the sensor apparatus 21 the curvature of the sensor apparatus 21 may be determined and the lower order Zernike coefficients may be advantageously determined without assuming that the sensor apparatus 21 has no curvature.

Whilst specific embodiments of design matrices have been described above in which specific unknowns and extra constraints are added to the design matrices, in some embodiments different unknowns and/or constraints may be added to a design matrix. In general any extra constraints may be added to a design matrix which allow a desired set of unknowns to be determined. For a given set of unknowns there may be multiple different extra constraints or combinations of extra constraints which may be added to a design matrix and which may mathematically allow the unknowns to be determined. The extra constraints which are added to a design matrix may be chosen based upon on the physical assumption to which each extra constraint relates.

In general an extra constraint which is added to a design matrix may relate to properties of the sensor apparatus 21, properties of the measurement patterning device MA' and/or the projection system PL or properties of the movement of the sensor apparatus relative to the patterning device MA'. As was described above, extra constraints which are added to a design matrix may be related to offsets and/or tilts of the patterned regions and/or the detector regions, may be related to offsets, tilts and/or magnifications which are introduced by shifting the sensor apparatus 21 relative to the patterning device MA' or may be related to the curvature of the patterning device MA' and/or the sensor apparatus 21. The number and nature of extra constraints which are added to a design matrix may depend on the number and nature of the unknowns which are to be determined.

Figure 7A:
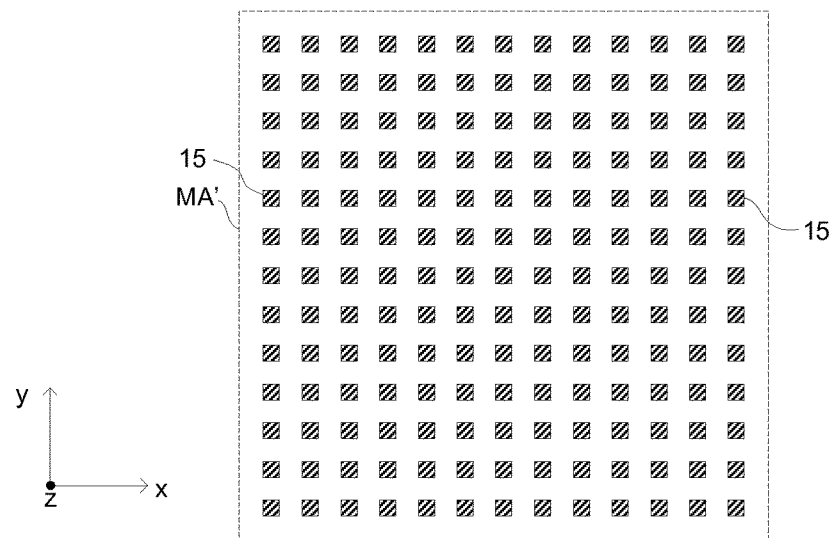
FIGS. 7A, 7B and 7C are schematic illustrations of alternative embodiments of a patterning device, a sensor apparatus and different relative configurations of the patterning device and the sensor apparatus.
Figure 7B:
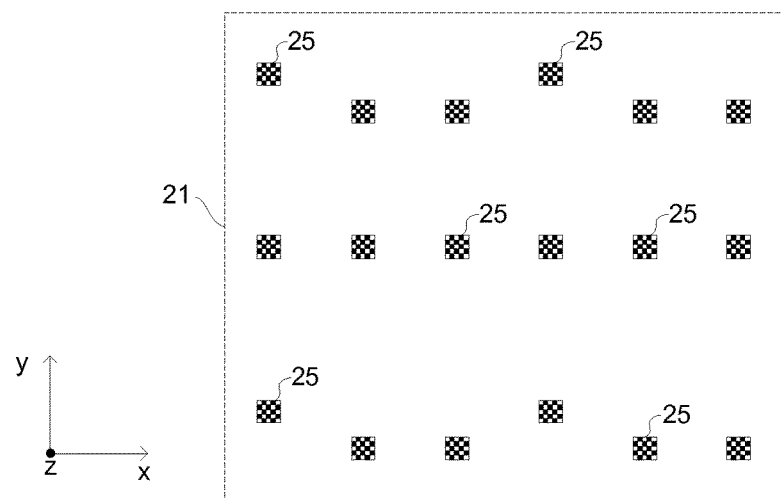
Figure 7C:
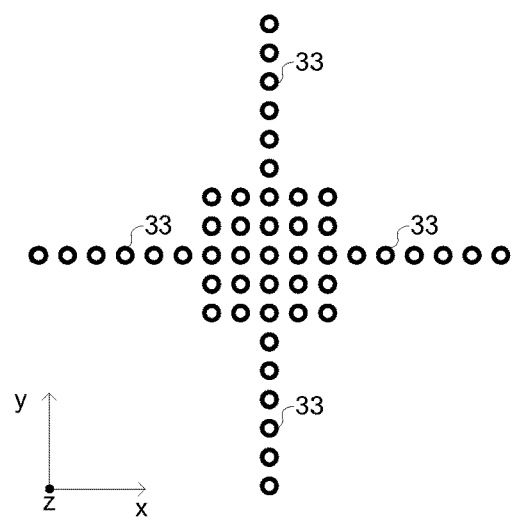

FIGS. 7A-C illustrate an alternative embodiment of a measurement patterned device MA', a sensor apparatus 21 and a plurality of shift positions of the sensor apparatus 21. FIG. 7A is a schematic illustration of the measurement patterning device MA' which includes a plurality of patterned regions 15 which are spaced apart in both the x and the y-directions. FIG. 7B is a schematic illustration of the sensor apparatus 21 which includes a plurality of detector regions 25 which are spaced apart in both the x and y-directions. FIG. 7C is a schematic illustration of a plurality of shift positions of the sensor apparatus 21 of FIG. 7B relative to the measurement patterning device MA' of FIG. 7A.

The measurement patterning device MA' which is shown in FIG. 7A comprises a 13 by 13 grid of patterned regions 15. The measurement patterning device MA' comprises a total of 169 patterned regions 15. Each of the patterned regions 15 may be illuminated simultaneously such that 169 measurement beams propagate through the projection system PL. The sensor apparatus 21 which is shown in FIG. 7B comprises 18 detector regions 25. Since there are fewer detector regions 25 than measurement beams only some of the measurement beams are received by a detector region 25 during a given relative configuration of the sensor apparatus 21 and the measurement patterned region MA'.

FIG. 7C shows a series of shift positions 33 of the sensor apparatus 21 relative to measurement patterning device MA'. In the embodiment which is shown in FIG. 7C, the sensor apparatus 21 is shifted to a total of 49 different shift positions. The sensor apparatus is shifted in the positive and negative x-directions and in the positive and negative y-directions relative to a central position 33'. As was described above shifting the sensor apparatus in both the x and y-directions allows the measurement beams to be measured at different x and y-positions on the sensor apparatus 21.

In some embodiments the sensor apparatus 21 may comprise more detector regions 25 than are shown in FIG. 7B. However, in some embodiments the space on a sensor apparatus 21 which is available for detector regions 25. For example, the sensor apparatus 21 may include other components (not shown) which may be used for other purposes (e.g. for alignment of the sensor apparatus 21). The sensor apparatus 21 may therefore only include a limited space which is available for the placement of detector regions 25. This may therefore limit the total number of detector regions 25 which are included on a sensor apparatus 21.

Furthermore, the detector regions may be spaced apart by a minimum spacing so as to ensure that each measurement beam can be measured separately. As depicted in FIG. 2 a sensor apparatus 21 may comprise a plurality of transmissive detector regions placed in proximity to a radiation sensor (e.g. a CCD array). The measurement beams are modified and transmitted at the detector regions and the modified measurement beams are measured at the radiation sensor. If the detector regions 25 are not adequately spaced apart then two or more modified measurement beams may be incident on the same region of the radiation sensor 23. In such instance, the different modified measurement beams may not be measured at the radiation sensor 23 independently of one another. The detector regions 25 may therefore be spaced apart by a minimum spacing in order to ensure that each modified measurement beam may be measured independently. Ensuring that the detector regions 25 are spaced apart by a minimum spacing may limit the number of detector regions 25 which are included on a sensor apparatus 21.

As was mentioned above, the patterned regions 15 may be illuminated at the same time or may be illuminated at different times. For example, each measurement in each relative configuration of the measurement patterning device MA' may comprise illuminating a plurality of subsets of patterned regions 15 to produce a plurality of subsets of measurement beams at different times.

Figure 8:
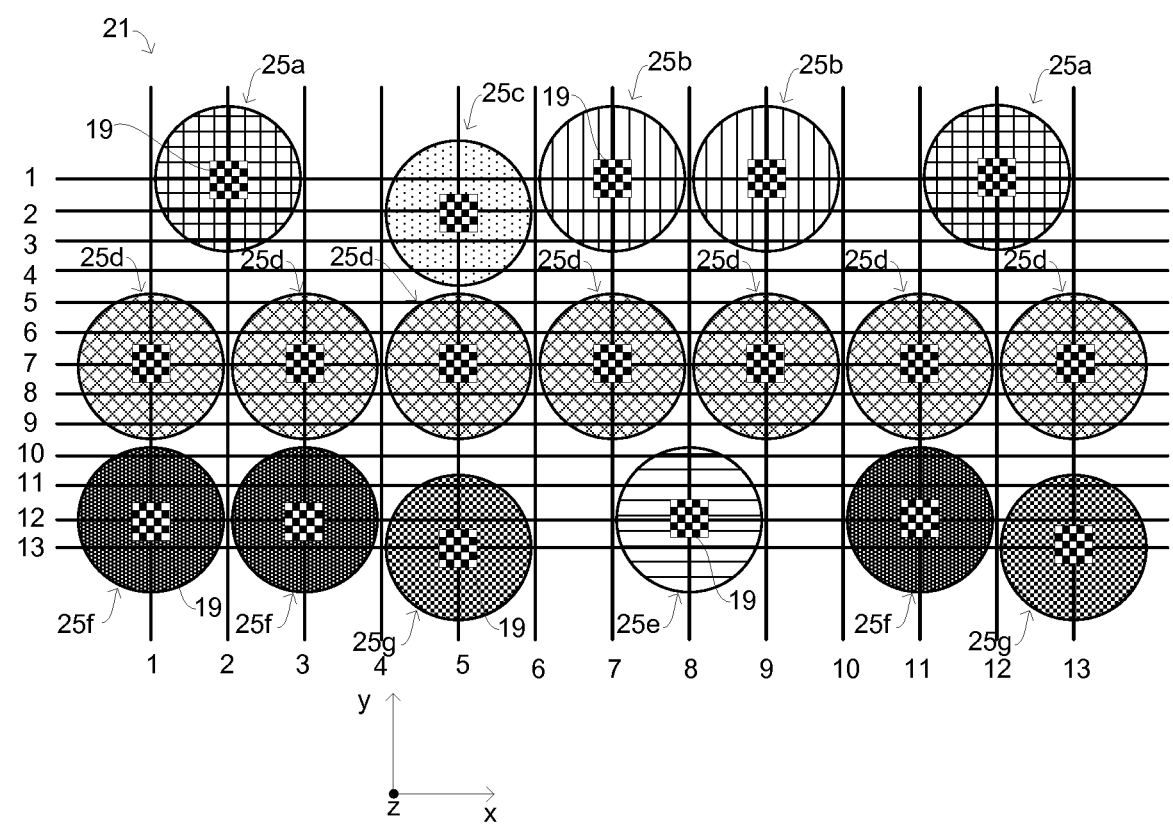
FIG. 8 is a schematic illustration of an alternative embodiment of a sensor apparatus.

FIG. 8 is a schematic illustration of the illumination of a plurality of subsets of sensor regions 25 of a sensor apparatus 21. The sensor apparatus 21 which is shown in FIG. 8 comprises a plurality of diffraction gratings 19 which form detector regions 25. When illuminated by measurement beams the diffraction gratings 19 modify the measurement beams and transmit the modified measurement beams so as to illuminate regions of a radiation sensor 23 which is positioned below the diffraction gratings 19. The regions of the radiation sensor 23 which are illuminated by measurement beams being transmitted at the diffraction gratings 19 are depicted in FIG. 8 by patterned circles. The diffraction gratings 19 and their respective regions of the radiation sensor 23 together form detector regions 25. The spacing between diffraction gratings 19 is large enough such that the different portions of the radiation sensor 23 which are illuminated by modified measurement beams do not overlap with each other.

In the embodiment which is shown in FIG. 8, the detector regions 25 comprise a plurality of subsets of detector regions 25a-25g. Each subset of detector regions 25a-25g represents one or more detector regions which are illuminated by measurement beams at the same time. The diffraction gratings 19 and the detector regions 25 are organised on a 13×13 grid as is shown in FIG. 8. In an embodiment detector regions 25 which are located at different y-positions on the grid may be illuminated at different times. Detector regions 25 which are located at even x-positions on the grid may be illuminated at different times to detector regions 25 which are located at odd x-positions on the grid.

In the embodiment which is shown in FIG. 8 a first subset of detector regions 25a and a second subset of detector regions are both located at a y=1 position on the grid. The first subset of detector regions 25a includes two detector regions 25a which are both located at even x-positions on the grid (x=2 and x=12). The second subset of detector regions 25b includes two detector regions 25b which are both located at odd x-positions on the grid (x=7 and x=9). The first subset of detector regions 25a is illuminated at a different time to the second subset of detector regions 25b. As is shown in FIG. 8, the sensor apparatus 21 further comprises further subsets of detector regions 25c-25g. Each subset of detector regions 25a-25g represents one or more detector regions which are illuminated at the same time.

The illumination of subsets of detector regions 25a-25g which was described above with reference to FIG. 8 represents the illumination of subsets of detector regions 25a-25g which occurs when the measurement patterning device MA' and the sensor apparatus 21 are positioned in a single relative configuration or shift position. Further illumination of subsets of detector regions 25a-25g may occur when the measurement patterning device MA' and the sensor apparatus 21 are positioned in other relative configurations or shift positions.

The embodiment which is shown in FIG. 8 is presented merely as an example. In other embodiments detector regions may be arranged differently to the detector regions 25 shown in FIG. 8 and may form subsets which are different to the subsets which are shown in FIG. 8.

Figure 9A:
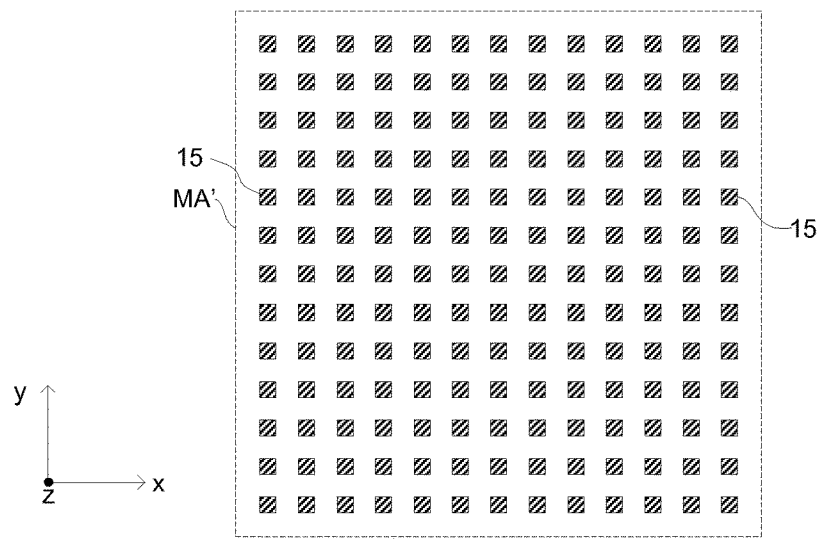
FIGS. 9A, 9B and 9C are schematic illustrations of alternative embodiments of a patterning device, a sensor apparatus and different relative configurations of the patterning device and the sensor apparatus.
Figure 9B:
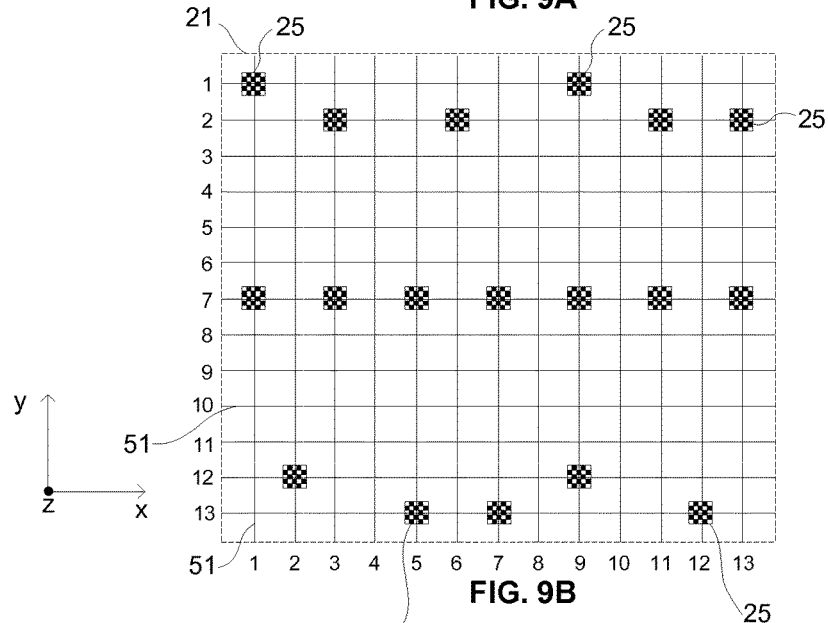
Figure 9C:
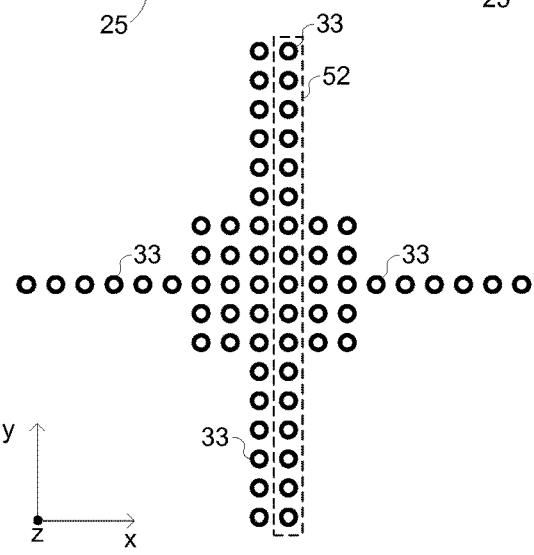

FIG. 9 is a schematic illustration of an alternative embodiment of a measurement patterned device MA', a sensor apparatus 21 and a plurality of shift positions of the sensor apparatus 21. FIG. 9A is a schematic illustration of the measurement patterning device MA' which includes a plurality of patterned regions 15 which are spaced apart in both the x and the y-directions. FIG. 9B is a schematic illustration of the sensor apparatus 21 which includes a plurality of detector regions 25 which are spaced apart in both the x and y-directions. FIG. 9C is a schematic illustration of a plurality of shift positions of the sensor apparatus 21 of FIG. 9B relative to the measurement patterning device MA' of FIG. 9A.

The measurement patterning device MA' which is shown in FIG. 9A comprises a 13 by 13 grid of patterned regions 15. The measurement patterning device MA' comprises a total of 169 patterned regions 15. Each of the patterned regions 15 may be illuminated simultaneously such that 169 measurement beams propagate through the projection system PL. Alternatively, different patterned regions 15 may be illuminated at different times such that different measurement beams propagate through the projection system PL at different times. The sensor apparatus 21 which is shown in FIG. 9B comprises 18 detector regions 25. Since there are fewer detector regions 25 than measurement beams only some of the measurement beams are received by a detector region 25 during a given relative configuration of the sensor apparatus 21 and the measurement patterned device MA'.

Also shown in FIG. 9B are grid lines 51. The grid lines 51 denote a 13×13 grid on which the detector regions 25 are arranged. Each of the detector regions 25 are centred at an intersection of the grid lines 51. The grid lines 51 are numbered from 1 to 13 in both the x and y-directions. As can be seen in FIG. 9B some of the detector regions 25 are situated at odd positions (i.e. on grid lines numbered with an odd number) in the x-direction and some of the detector regions 25 are situated at even positions (i.e. on grid lines numbered with an even number) in the x-direction. Similarly, some of the detector regions are situated at odd positions in the y-direction and some of the detector regions are situated at even positions in the y-direction.

As can be seen in FIG. 9A, the patterned regions 15 are also arranged on a 13×13 grid (no gridlines are shown in FIG. 9A). The grid 51 which is shown in FIG. 9B is equivalent to the grid on which the patterned regions 15 are situated. In a central shift position of the measurement patterned device MA' and the sensor apparatus 21, a measurement beam formed at a given patterned region 15 may be incident on a detector region 25 situated at an equivalent grid position to the given patterned region 15.

FIG. 9C shows a series of shift positions 33 of the sensor apparatus 21 relative to the measurement patterning device MA'. In the embodiment which is shown in FIG. 9C, the sensor apparatus 21 is shifted to a total of 62 different shift positions. The sensor apparatus is shifted in the positive and negative x-directions and in the positive and negative y-directions relative to a central position. As was described above, shifting the sensor apparatus in both the x and y-directions allows the measurement beams to be measured at different x and y-positions on the sensor apparatus 21.

The embodiment which is shown in FIGS. 9A-9C is similar to the embodiment shown in FIGS. 7A-7C except that the shift positions 33 which are shown in FIG. 9C include an extra column of shift positions relative to the shift positions 33 shown in FIGS. 7A-7C. The extra column of shift positions is marked with a dashed box labelled 52 in FIG. 9C. The extra column 52 of shift positions means that the full extent of shift positions in the y-direction occurs at two different x-positions as opposed to just one x-position as was shown in FIG. 7C. As will be explained in further detail below this may reduce the uncertainty associated with determined aberrations which result from the measurements at different shift positions.

As can be seen in FIG. 9B, the detector regions 25 are positioned at a relatively small number of positions on the y-axis and there are gaps in the y-direction at which no detector regions 25 are positioned. In contrast to this, there are detector regions 25 positioned at a number of different x-positions and there are no large gaps in the x-direction at which there are no detector regions 25 positioned. The layout of the detector regions 25 thus provides a denser sampling in the x-direction than in the y-direction. As was described above the layout of detector regions 25 on the sensor apparatus may be limited by other features which are also provided on the sensor apparatus 21 for other purposes (not shown in the Figures). It some embodiments it may not therefore be possible to position detector regions 25 so as to provide denser sampling in the y-direction.

As a consequence of the denser sampling provided in the x-direction as opposed to the y-direction (by the arrangement of detector regions 25) the information which is obtained at different shift positions in the y-direction may provide especially useful information content. As was explained above in the layout of shift positions of FIG. 7C the full extent of the shift positions in the y-direction only occurs at a single x-position. Consequently the information obtained at the outermost shift positions in the y-direction is only obtained at a single x-position.

Whilst the sampling of detector regions 25 is relatively dense in the x-direction, it can be seen from FIG. 9B that the majority of detector regions are positioned at odd-positions in the x-direction. At the outermost shift positions in the y-direction, it is therefore mostly measurement beams originating from patterned regions 15 positioned at odd-positions in the x-direction which are sampled by the detector regions 25. There is thus a relative shortage of information obtained at the outermost shift positions in the y-direction relating to measurement beams originating from patterned regions 15 positioned at even-positions in the x-direction.

In the layout of shift positions which is shown in FIG. 9C the two central columns of shift position locations (i.e. the extra column 52 and the column immediately to the left of the extra column 52 in FIG. 9C) provide sampling of measurement beams originating from adjacent patterned regions in the x-direction. Consequently shift positions in one of the central columns will mostly lead to sampling of measurement beams originating from patterned regions 15 positioned at odd-positions in the x-direction (as a consequence of the larger number of odd-positioned detector regions on the sensor apparatus 21). Shift positions in the other of the central columns will mostly lead to sampling of measurement beams originating from patterned regions positioned at even-positions in the x-direction. The extra-column 52 of shift positions in FIG. 9C therefore ensures that measurement beams originating from patterned regions at both even and odd x-positions are equally sampled at the outermost shift positions in the y-direction (i.e. the relative configurations at the extremes of the maximum extent of the relative configuration in the y-direction). This may provide useful extra information content when compared to the layout of shift positions shown in FIG. 7C.

Figure 10A:
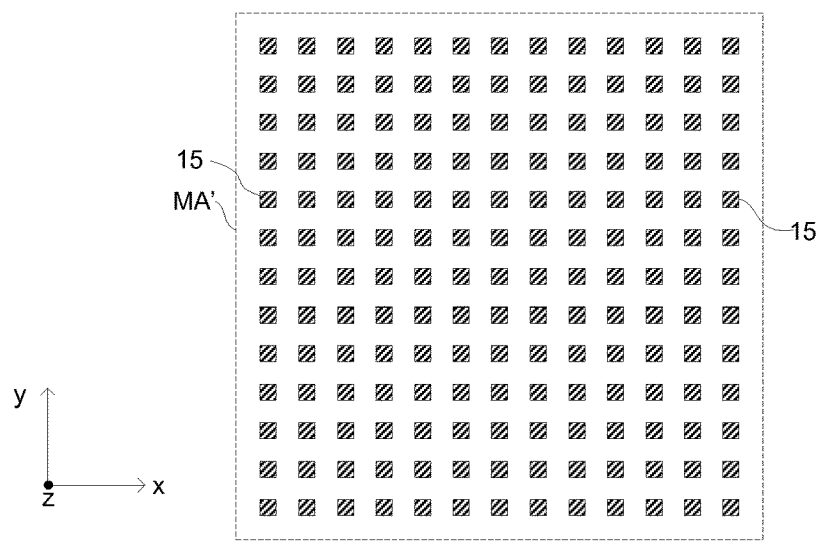
FIGS. 10A, 10B and 10C are schematic illustrations of further alternative embodiments of a patterning device, a sensor apparatus and different relative configurations of the patterning device and the sensor apparatus.
Figure 10B:
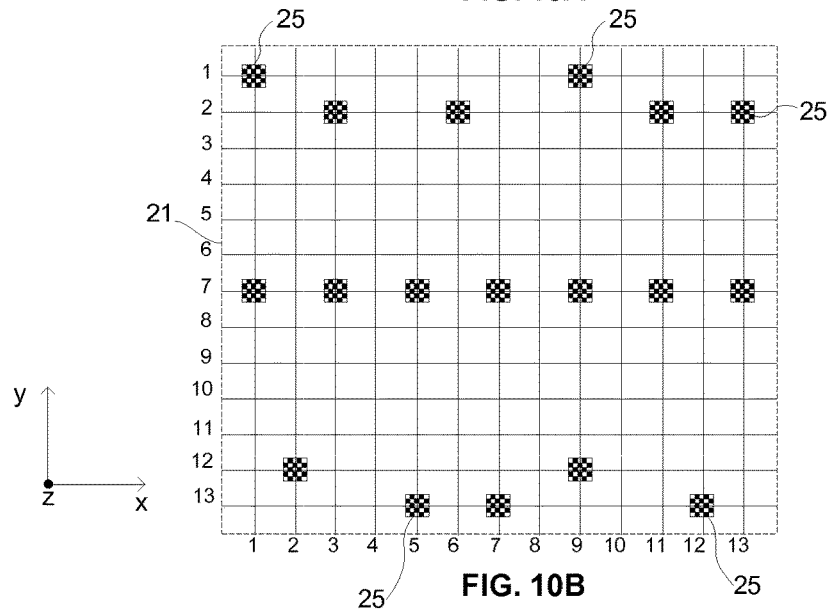
Figure 10C:
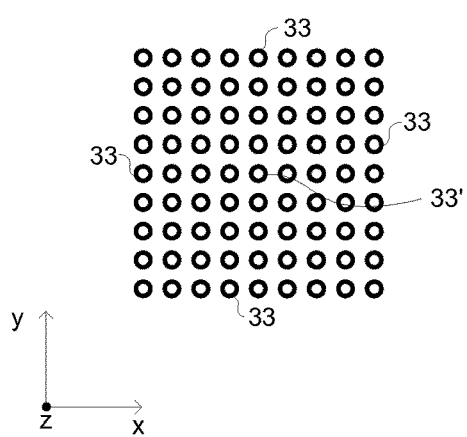

FIG. 10 is a schematic illustration of an alternative embodiment of a measurement patterned device MA', a sensor apparatus 21 and a plurality of shift positions of the sensor apparatus 21. FIG. 10A is a schematic illustration of the measurement patterning device MA' which includes a plurality of patterned regions 15 which are spaced apart in both the x and the y-directions. FIG. 10B is a schematic illustration of the sensor apparatus 21 which includes a plurality of detector regions 25 which are spaced apart in both the x and y-directions. FIG. 10C is a schematic illustration of a plurality of shift positions of the sensor apparatus 21 of FIG. 10B relative to the measurement patterning device MA' of FIG. 10A.

The measurement patterning device MA' which is shown in FIG. 10A is the same as the measurement patterning device MA' which is shown in FIG. 9A and will not be described here in any more detail. The sensor apparatus 21 shown in FIG. 10B is the same as the measurement patterning device MA' which is shown in FIG. 9B and will not be described here in any more detail.

FIG. 10C shows a series of shift positions 33 of the sensor apparatus 21 relative to the measurement patterning device MA'. In the embodiment which is shown in FIG. 10C, the sensor apparatus 21 is shifted to a total of 81 different shift positions. The sensor apparatus is shifted in the positive and negative x-directions and in the positive and negative y-directions relative to a central position 33'. As was described above, shifting the sensor apparatus in both the x and y-directions allows the measurement beams to be measured at different x and y-positions on the sensor apparatus 21.

The embodiment which is shown in FIGS. 10A-10C is similar to the embodiment shown in FIGS. 9A-9C except that the layout of shift positions 33 which are shown in FIG. 10C differs from the layout shown in FIG. 9C. In the embodiment which is shown in FIG. 10C, the shift positions 33 are arranged to form a square shape. Consequently the full extent of shift positions in the y-direction is sampled at every x-position. As was described above with reference to FIG. 9C, sampling the full extent of shift positions in the y-direction at a plurality of different x-positions may provide valuable information content which reduces uncertainties associated with resulting aberration determinations.

FIGS. 11A-11I are schematic representations of uncertainties related to aberration determinations at different field points in the x and y-directions (i.e. different spatial locations in an image plane of the projection system). The uncertainties may be obtained, for example, by performing a set of measurements at different shift positions multiple times and comparing the aberrations determinations which result from each set of measurements.

FIGS. 11A-11C show uncertainties in aberration determinations obtained from measurements using the shift position layout shown in FIG. 7C. FIGS. 11D-11F show uncertainties in aberration determinations obtained from measurements using the shift position layout shown in FIG. 9C. FIGS. 11G-11I show uncertainties using the layout of shift positions shown in FIG. 10C. FIGS. 11A, 11D and 11G show uncertainties related to aberrations in the x-direction (e.g. related to the determination of the second Zernike coefficient), FIGS. 11B, 11E and 11H show uncertainties related to aberrations in the y-direction (e.g. related to the determination of the third Zernike coefficient) and FIGS. 11G, 11H and 11I show uncertainties related to aberrations in the z-direction (e.g. related to the determination of the fourth Zernike coefficient).

It can be seen from a comparison of FIGS. 11A-11C with FIGS. 11D-11F that using the layout of shift positions of FIG. 9C substantially reduces the magnitude of the uncertainties when compared to using the layout of shift positions FIG. 7C. The extra column 52 in the layout of shift positions FIG. 9C thus advantageously reduces measurement uncertainties associated with aberration determinations obtained from the measurements at different shift positions.

It can be further seen from FIGS. 11A-11I that the magnitude of the uncertainties is further reduced by using the shift positions pattern of FIG. 10C when compared to using the shift position patterns of FIGS. 7C and 9C. Furthermore, by using the shift position pattern of FIG. 10C the spatial homogeneity of the uncertainties is improved. For example, in FIGS. 11C and 11F the uncertainties show a spatial pattern corresponding to the shape of the shift position patterns of FIGS. 7C and 9C respectively. By contrast, in FIG. 11I the uncertainties are relatively spatially homogenous, which reflects the square shaped pattern of shift positions of FIG. 10C.

In each of the embodiments described above, the measurement patterning device and/or the sensor apparatus are moved between a plurality of different relative configurations. In each different relative configuration measurements of radiation at the detector regions is made and these measurements are used to determine aberrations caused by the projection system.

In the embodiments shown in FIGS. 6A-6C, FIGS. 7A-7C, FIGS. 9A-9C and FIGS. 10A-10C, the plurality of different relative configurations includes configurations which are separated from each other in the x-direction and includes configurations which are separated from each other in the y-direction.

The plurality of different relative configurations have a maximum extent in the y-direction. For example, in the embodiments of FIGS. 7C and 9C, the maximum extent of the configurations in the y-direction corresponds to the extent of the central column in FIG. 7C and the two central columns (including the extra column 52) in FIG. 9C. In FIG. 10C the maximum extent of the configurations in the y-direction corresponds to the extent in the y-direction of the square shape formed by the shift positions shown in FIG. 10C.

In the embodiments of FIGS. 9C and 10C the plurality of different relative configurations includes relative configurations at extremes of the maximum extent in the y-direction at a plurality of positions in the x-direction. For example, in the embodiment of FIG. 9C, the extremes of the maximum extent in the y-direction are reached at both of the central columns (including the extra column 52), which are positioned at different x-positions. In the embodiment of FIG. 10C, the extremes of the maximum extent in the y-direction are reached at each x-position in the pattern of shift positions.

In some embodiments the plurality of different relative configurations may be arranged to substantially form a rectangle, as is shown in FIG. 10C. In some embodiments, such as the one shown in FIG. 10C, the rectangle may be a square.

As was described above, in general measurements made at different shift positions are added to a design matrix and the design matrix is solved in order to derive aberrations caused by the projection system. Typically in order to solve the design matrix a number of constraints are added to the design matrix in the form of extra equations (or equivalently extra rows are added to the matrix). The constraints allow singularities to be removed from the design matrix so as to allow a solution to be found.

The constraints are based on physical assumptions related to the measurement patterning device MA', the sensor apparatus 21 and the relative movement of the measurement patterning device MA' and the sensor apparatus 21. Constraints may relate to offsets of features. For example, constraints may relate to the offset of patterned regions 25, detector regions 25 and/or offsets in the relative movement of the measurement patterning device MA' and the sensor apparatus 21. Some constraints may relate to a tilt or magnification of components. For example, constraints may relate to a tilt of the measurement patterning device MA', the sensor apparatus 21 and/or tilts in the movement of the measurement patterning device MA' and the sensor apparatus 21. In some embodiments constraints may be used which include quadratic terms, for example, constraints which relate to a curvature of components.

In some embodiments, different constraints may be used in order to determine different Zernike coefficients. For example, different constraints may be used in order to determine the fourth Zernike coefficient to constraints which are used to determine the second and third Zernike coefficients. In particular, it may be desirable not to use constraints related to a curvature of components (e.g. constraints which include quadratic terms) in order to determine the second and third Zernike coefficients. Constraints related to a curvature of components may however, be used to determine the fourth Zernike coefficient (and/or other Zernike coefficients).

The constraints which are chosen in order to determine one or more Zernike coefficients may be made based on the physical assumptions which underlie the constraints and the effects of the physical assumptions on the one or more Zernike coefficients to be determined. In general, in embodiments in which at least one of the patterning device and the sensor apparatus are moved relative to each other in two different directions (e.g. the x and y-directions) in order to perform measurements, and in which aberrations are determined in three dimensions, a total of nine different constraints may be added to a design matrix in order to determine each Zernike coefficient at each field point.

In some embodiments, the same set of constraints may be used in order to determine the second and third Zernike coefficients and a different set of constraints may be used to determine the fourth Zernike coefficient.

In some embodiments the constraints used to determine the second and/or the third Zernike constraints may include constraints in the form of assuming that a sum of offsets of the patterned regions 15 are equal to zero in both the x and y-directions (i.e. this assumption forms two separate constraints, one in the x-direction and one in the y-direction). Such constraints may have a form similar to the constraint described above with reference to equation (2). The constraints may further include constraints in the form of assuming that a sum of offsets of the detector regions 25 are equal to zero in both the x and y-directions (i.e. this assumption forms two separate constraints, one in the x-direction and one in the y-direction). Such constraints may further include constraints similar to the constraint described above with reference to equation (1).

The constraints may further include constraints in the form of linear terms in x and y, which relate to the tilt or magnification of measurement patterning device MA'. For example, the constraints may include constraints in the form of assuming that the magnification of the sensor apparatus is substantially equal to a design magnification in both the x and y-directions (i.e. this assumption forms two separate constraints, one in the x-direction and one in the y-direction). Such constraints may have a form similar to the constraint described above with reference to equation (4). The constraints may further include constraints in the form of assuming that the measurement sensor apparatus 21 is not tilted in the x-direction or in the y-direction (i.e. this assumption forms two separate constraints, one in the x-direction and one in the y-direction).

The constraints may further include a constraint in the form of assuming that relative movement of the measurement patterning device MA' and the sensor apparatus 21 do not include any offsets in the form of a rotation about the z-axis.

In some embodiments, the above described constraints may form the nine constraints added to the design matrix used to determine the second and third Zernike coefficients.

A set of constraints used to determine the fourth Zernike coefficient may be different to the above described constraints. In some embodiments, the constraints used to determine the fourth Zernike coefficient may include a constraint in the form of an assumption that a sum of offsets of the patterned regions 15 in the z-direction is equal to zero. The constraints may further include a constraint in the form of an assumption that a sum of offsets of the detector regions 25 in the z-direction is equal to zero.

The constraints may further include constraints in the form of linear terms in x and y, which relate to changes in position in the z-direction as a function of position in x and y. For example, the constraints may include constraints in the form of an assumption that the position of the detector regions 25 in the z-direction do not change as a function of x or y (i.e. this assumption forms two separate constraints, one in the x-direction and one in the y-direction).

The constraints may further include constraints in the form of assuming that relative movements of the measurement patterning device MA' and the sensor apparatus 21 do not include any offsets in the form of a rotation about the x-axis or rotation about the y-axis (i.e. these assumptions form two separate constraints, one related to rotation about the x-axis and one related to rotation about the y-axis).

The constraints may further include constraints in the form of quadratic terms. For example, the constraints may include constraints in the form of an assumption that relative movements of the measurement patterning device MA' and the sensor apparatus 21 do not include any curvature in the x-direction or in the y-direction and do not include offsets as a function of x times y (i.e. this assumption forms three separate constraints).

In some embodiments, the above described constraints may form the nine constraints added to the design matrix used to determine the second and third Zernike coefficients.

In other embodiments constraints other than those described above may be used. However, the constraints described above have been found to be particularly advantageous for use in deriving the second, third and fourth Zernike coefficients (as described above).

In some embodiments, as an alternative to using constraints in the form of physical assumptions, one or more of the constraints may be replaced with information derived from measurements taken by another sensor. For example, one or more alignment sensors may be used in a lithographic apparatus and the results of measurements made by the one or more alignment sensors may be added to a design matrix in place of a constraint based upon a physical assumption. In some embodiments, a separate alignment sensor may be used to measure offsets and/or magnifications associated with the sensor apparatus 21 and detector regions 25. These measurements may be added to a design matrix in place of constraints related to assumptions involving offsets and/or magnifications of the sensor apparatus 21 and detector regions 25. Use of information derived from measurements as opposed to being based on assumptions may advantageously lead to an increase in accuracy of the determined aberrations.

Methods and apparatus have been described above which are suitable for determining aberrations which are caused by a projection system PL. In particular, a measurement patterning device comprising a plurality of patterned regions is illuminated with radiation thereby forming a plurality of measurement beams. The measurement beams are projected, by a projection system, onto a sensor apparatus comprising a plurality of detector regions. The measurement patterning device and the sensor apparatus are positioned in at least two different relative configurations. In at least one relative configuration at least one of the detector regions of the sensor apparatus receives a different measurement beam to a measurement beam which is received at the respective detector region in at least one of the other relative configurations. This allows a measurement beam to be measured at a plurality of different detector regions.

Measuring a measurement beam at a plurality of different detector regions provides information about properties of the sensor apparatus, such as the configuration, position and orientation of the sensor apparatus. Different measurements of a measurement beam which are made at different detector regions may be combined to derive aberrations which are caused by the projection system whilst accounting for unknown properties of the sensor apparatus. This allows aberrations relating to both lower order and higher order Zernike coefficients to be determined at the same time from a set of measurements. The projection system PL may then be adjusted in response to the determined aberrations in a single adjustment process. This advantageously provides a substantial time saving when compared to an iterative calibration process in which different aberrations are determined and adjustments made multiple times. For example, determining aberrations which are caused by a projection system and adjusting the projection system to correct for the determined aberrations as an iterative calibration process may take of the order of approximately 46 hours to complete.

In contrast to an iterative calibration process, the methods and apparatus which are disclosed herein may allow aberrations which are caused by a projection system to be determined and corrected for in a calibration process which takes of the order of approximately 23 hours to complete. The methods and apparatus which are disclosed herein may therefore advantageously reduce the time needed to complete a calibration of a projection system by a factor of approximately two or more. Reducing the time needed to complete a calibration of a projection system advantageously reduces the time during which a lithographic apparatus is taken offline in order to perform a calibration process.

In the embodiments which have been described above, a sensor apparatus 21 is moved relative to a measurement patterning device MA' so as to change a detector region 25 of the sensor apparatus 21 at which a given measurement beam is received. In some embodiments the measurement patterning device MA' may additionally or alternatively be moved relative to the sensor apparatus 21 so as to change a measurement beam which is received at a particular detector region 25 of the sensor apparatus 21.

In the context of this description a measurement beam is identified by the patterned region 15 of the measurement patterning device MA' at which the measurement beam is modified. For example, a measurement patterning device MA' and a sensor apparatus 21 may be arranged in a first relative configuration in which a first measurement beam which is modified at a first patterned region is received at a first detector region. The measurement patterning device MA' may then be moved relative to the sensor apparatus 21 such that the first measurement beam which is modified at the first patterning device is received at a second detector region which is different to the first detector region. Movement of the measurement patterning device MA' may also result in a second measurement beam which is modified at a second patterned region being received at the first detector region in the second relative configuration. Movement of the measurement device MA' may therefore change a measurement beam which is received at a given detector region and may allow a given measurement beam to be measured at multiple detector regions. As was described above the measurement of a given measurement beam at multiple detector regions advantageously provides information which allows aberrations which are caused by the projection system to be determined.

Movement of the measurement patterning device MA' as opposed to movement of the sensor apparatus 21 may provide more information about properties of the measurement patterning device MA'. As was described above, movement of the sensor apparatus 21 allows aberrations which are caused by the projection system PL to be determined whilst accounting for unknown properties of the sensor apparatus 21 and movement of the sensor apparatus 21. This allows aberrations which are caused by the projection system PL to be distinguished from aberrations which are caused by uncertainties in properties of the sensor apparatus 21. Movement of the measurement patterning device MA' may allow aberrations which are caused by the projection system PL to be determined whilst accounting for unknown properties of the measurement patterning device MA' and movement of the measurement patterning device MA'. This may allow aberrations which are caused by the projection system PL to be distinguished from aberrations which are caused by uncertainties in properties of the measurement patterning device MA'.

In some embodiments the measurement patterning device MA' may be shifted in the y-direction relative to the sensor apparatus 21. As was described above with reference to FIGS. 1 and 2, a measurement patterning device MA' may be supported by a support structure MT of a lithographic apparatus. A support structure MT of a lithographic apparatus may be configured to move in the y-direction. For example, during normal use of a lithographic apparatus a support structure may scan a patterning device MA in the y-direction in order to scan the patterning device MA relative to a substrate W. Movement of a measurement patterning device MA' in the y-direction may therefore be achieved without alteration of the support structure MT. In some embodiments the measurement patterning device MA' may additionally or alternatively be moved in the x-direction.

In some embodiments, the measurement patterning device MA' may be moved instead of moving the sensor apparatus 21. In other embodiments both the measurement patterning device MA' and the sensor apparatus 21 may be moved. For example, one of the measurement patterning device MA' and the sensor apparatus 21 may be moved (e.g. in the x and/or the y-directions) and a first plurality of measurements may be taken in a plurality of different relative configurations. Subsequently the other of the measurement patterning device MA' and the sensor apparatus 21 may be moved (e.g. in the x and/or the y-directions) and a second plurality of measurements may be taken in a plurality of different relative configurations. The first plurality of measurements may be combined with the second plurality of measurements in order to determine aberrations which are caused by the projection system PL.

Whilst methods have been described above in which the measurement patterning device MA' and/or the sensor apparatus 21 are moved relative to each other in the x and/or the y-directions, in some embodiments movement of the measurement patterning device MA' and/or the sensor apparatus 21 are moved relative to each other in other directions. For example, a measurement patterning device MA' and/or a sensor apparatus 21 may be moved relative to each other in a first direction and in a second direction. In some embodiments the first direction may be perpendicular to the second direction (e.g. the x and y-directions). However, in other embodiments the first direction may not be perpendicular to the second direction. For example, in some embodiments the first direction may form an angle of approximately 60° or less with the second direction.

Embodiments have been described above in which shearing interferometry is used in order to determine aberrations which are caused by the projection system PL. As has been described above, shearing interferometry measurements may allow both lower order and higher order aberrations to be determined from the measurements. For example, placement aberrations of a wavefront (e.g. the second, third and fourth Zernike coefficients) may be determined and higher order aberrations (e.g. Zernike coefficients having a Noll index of 5 or more) may be determined.

However in some embodiments methods other than shearing interferometry may be used. In such embodiments the measurements may only be used to determine placement aberrations of a wavefront (e.g. the second, third and fourth Zernike coefficients) and may not be used to determine higher order aberrations. For example, a measurement system which is suitable for determining the alignment of an image which is formed by the projection system PL and which may be referred to as a transmission image sensor or an aerial image sensor may be used in accordance with the invention.

A transmission image sensor includes a patterning device comprising a plurality of patterned regions (which may be referred to as alignment marks) and a sensor apparatus comprising a plurality of detector regions. The patterned regions may, for example, each comprise a series of parallel transmissive slits. Radiation which is transmitted by a patterned region forms a measurement beam. The sensor apparatus comprises a plurality of detector regions arranged to receive the measurement beams. Each detector region may, for example, comprise a patterned region (e.g. a series of parallel transmissive slits) and a radiation detector arranged to receive a measurement beam which is transmitted by the patterned region. The radiation detector is configured to measure the intensity of the measurement beam which is transmitted at the patterned region of the sensor apparatus.

As was described above in the context of other embodiments of a measurement system the patterning device and/or the sensor apparatus may be moved relative to each other between a plurality of relative configurations. For example, the patterning device and/or the sensor apparatus may be moved between at least a first relative configuration in which at least some of the detector regions each receive a measurement beam and a second relative configuration in which at least some of the detector regions receive a different measurement beam to the measurement beam which was received at the respective detector region when the patterning device and the sensor apparatus were positioned in the first relative configuration.

In each relative configuration one or more measurements may be made by the sensor apparatus. For example, the intensity of radiation which is incident on each radiation detector may be measured in each relative configuration. In some embodiments the sensor apparatus and/or the patterning device may be moved relative to each other whilst the sensor apparatus and the patterning device remain in a given relative configuration (e.g. the first or second relative configuration). For example, the sensor apparatus may be moved in the x, y and/or z-directions whilst the measurement beams which are received at each detector region stays the same. The variation in intensity of radiation which is incident on each radiation detector may be measured and may provide information about the placement of the image which is projected by the projection system.

Measurements which are made in the first relative configuration may collectively be referred to as a first measurement and measurements which are made in the second relative configuration may collectively be referred to as a second measurement. Similarly to the embodiments which were described above, the first and second measurements may be used to determine aberrations caused by the projection system. The aberrations which are determined may, for example, correspond to the placement of wavefronts incident on the sensor apparatus and may be determined by determining one or more Zernike coefficients having a Noll index of 4 or less.

Measuring the measurement beams whilst the patterning device and the sensor apparatus are in a plurality of different relative configurations results in at least one measurement beam being measured at a plurality of detector regions. As was described above with reference to other embodiments, this may advantageously provide information about the sensor apparatus. Consequently aberrations caused by the projection system may be determined whilst accounting for unknown properties of the sensor apparatus.

In embodiments in which a transmission image type sensor is used to determine lower order placement aberrations additional measurements may be used which allows higher order aberrations to be determined. For example, shearing interferometry measurements of the type which were described above may additionally be made and may allow higher order (e.g. Zernike coefficients having a Noll index of 5 or more) to be determined.

Whilst embodiments have been described above in which a measurement system is of a transmissive type, in other embodiments a reflective type measurement system may be used. For example, the patterning device may comprise reflective patterned regions, the projection system may include one or more reflective optics and/or the detector regions may include reflective optics.

While specific embodiments of the invention have been described above, it will be appreciated that the invention may be practiced otherwise than as described. The description is not intended to limit the invention.

The invention claimed is:

1. A method of determining aberrations caused by a projection system, the method comprising:
   illuminating a patterning device with radiation, wherein the patterning device comprises a plurality of patterned regions, each patterned region patterning a measurement beam;
   projecting, with the projection system, the measurement beams onto a sensor apparatus comprising a plurality of detector regions;
   making a first measurement of the radiation at the detector regions when the patterning device and the sensor apparatus are positioned in a first relative configuration in which at least some of the plurality of detector regions each receive a measurement beam;
   moving at least one of the patterning device and the sensor apparatus in a first direction so as to change the relative configuration of the patterning device to a second relative configuration;
   making a second measurement of the radiation at the detector regions when the patterning device and the sensor apparatus are positioned in the second relative configuration in which each of the at least some of the plurality of detector regions receives a different measurement beam, as compared to the measurement beam which was received at the respective one of the at least some of the plurality of detector regions when the patterning device and the sensor apparatus were positioned in the first relative configuration; and
   determining from the first measurement and the second measurement the aberrations caused by the projection system.

2. The method of claim 1, wherein the first measurement and the second measurement are used to separate ones of the aberrations which are caused by the projection system from ones of the aberrations which are a result of errors in positioning and/or configuration of the sensor apparatus.

3. The method of claim 1, wherein:
   the moving at least one of the patterning device and the sensor apparatus comprises moving the sensor apparatus in the first direction,
   the at least some of the detector regions of the sensor apparatus are spaced apart from each other in the first direction, and
   the moving the sensor apparatus in the first direction comprises stepping the sensor apparatus by a distance in the first direction which is approximately equal to a separation between the detector regions in the first direction.

4. The method of claim 1, further comprising:
   moving at least one of the patterning device and the sensor apparatus so as to change the relative configuration of the patterning device to a third relative configuration; and
   making a third measurement of radiation at the detector regions when the patterning device and the sensor apparatus are positioned in the third relative configuration in which each of the at least some of the plurality of detector regions receives a different measurement beam, compared to the measurement beam which was received at the respective one of the at least some of the plurality of detector regions when the patterning device and the sensor apparatus were positioned in the first relative configuration and in the second relative configuration,
   wherein the moving at least one of the patterning device and the sensor apparatus so as to change the relative configuration of the patterning device and the sensor apparatus to the third configuration comprises moving at least one of the patterning device and the sensor apparatus in a second direction, wherein the second direction is different than the first direction.

5. The method of claim 4, wherein:
   the moving at least one of the patterning device and the sensor apparatus in the second direction comprises moving the sensor apparatus in the second direction,
   the at least some of the detector regions of the sensor apparatus are spaced apart from each other in the second direction, and
   the moving the sensor apparatus in the second direction comprises stepping the sensor apparatus by a distance in the second direction which is approximately equal to a separation between the detector regions in the second direction.

6. The method of claim 1, further comprising:
   moving at least one of the patterning device and the sensor apparatus between a plurality of different relative configurations in which at least some of the plurality of detector regions receive a different measurement beam to a measurement beam received at the respective detector region when the patterning device and the sensor apparatus are positioned in a different one of the plurality of relative configurations,
   in each of the plurality of relative configurations, a measurement of radiation at the detector regions is made so as to perform a plurality of measurements made at a plurality of different relative configurations, and
   determining aberrations caused by the projection system comprises determining the aberrations from the plurality of measurements.

7. The method of claim 6, wherein the plurality of different relative configurations include relative configurations which are separated from each other in the first direction and relative configurations which are separated from each other in a second direction different to the first direction.

8. The method of claim 7, wherein:
   the plurality of different relative configurations have a maximum extent in the second direction, the plurality of different relative configurations include relative configurations at extremes of the maximum extent in the second direction, at a plurality of positions in the first direction, and the plurality of different relative configurations are arranged to substantially form a rectangle.

9. The method of claim 1, further comprising:

moving at least one of the patterning device and the sensor apparatus whilst the patterning device and the sensor apparatus are in the first and/or the second relative configuration, wherein the movement is such that the measurement beams, which are received at the detector regions, remains the same throughout the movement.

10. The method of claim 9, wherein the first measurement and/or the second measurement comprises measuring variations in radiation at the detector regions during the movement of at least one of the patterning device and the sensor apparatus.

11. The method of claim 1, wherein the determining aberrations which are caused by the projection system comprises determining a placement of the patterned regions and/or the detector regions.

12. The method of claim 1, wherein:

the determining aberrations which are caused by the projection system comprises making one or more physical assumptions about the sensor apparatus and/or the patterning device, and the determining aberrations which are caused by the projection system further comprises making a first set of the one or more physical assumptions in order to determine a first set of one or more aberrations and making a second set of the one or more physical assumptions in order to determine a second set of one of more aberrations.

13. The method of any of claim 12, wherein the one or more physical assumptions about the sensor apparatus and/or the patterning device comprises:

assuming that each detector region has an associated offset and that a sum of the offsets in a third direction is equal to zero;

assuming that each patterned region has an associated offset and a sum of the offsets in the third direction is equal to zero;

assuming that a position of each detector region in the third direction is not a function of a position in the first direction and a second direction, wherein the first, second and third directions are each perpendicular to each other;

assuming that the movements of at least one of the patterning device and the sensor apparatus do not include any offsets in a form of a rotation about the first direction or a rotation about the second direction; or assuming that the movements of at least one of the patterning device and the sensor apparatus do not include any curvature in the first direction or in the second direction and do not include any offsets which are a function of a multiple of a position in the first direction and a position in the second direction.

14. The method of claim 1, wherein at least one of the plurality of detector regions that received a measurement beam, when the patterning device and the sensor apparatus were positioned in the first relative configuration, does not receive any measurement beam when the patterning device and the sensor apparatus are positioned in the second relative configuration.

15. A measurement system for determining aberrations caused by a projection system, the measurement system comprising:

a patterning device comprising a plurality of patterned regions, wherein each patterned region is configured to pattern a measurement beam when illuminated with radiation;

an illumination system arranged to illuminate the patterning device with the radiation;

a sensor apparatus comprising a plurality of detector regions, wherein the sensor apparatus is configured to measure the radiation at the detector regions;

wherein the projection system is configured to project the measurement beams onto the sensor apparatus;

a positioning apparatus configured to move at least one of the patterning device and the sensor apparatus in a first direction so as to change a relative configuration of the patterning device and the sensor apparatus between a first relative configuration and a second relative configuration; and a controller configured to:

receive a first measurement of the radiation at the detector regions of the sensor apparatus when the patterning device and the sensor apparatus are positioned in the first relative configuration in which at least some of the plurality of detector regions each receive at least one of the measurement beams;

receive a second measurement of radiation at the detector regions of the sensor apparatus when the patterning device and the sensor apparatus are positioned in the second relative configuration in which each of the at least some of the plurality of detector regions receives a different measurement beam to the measurement beam which is received at the respective one of the at least some of the plurality of detector regions when the patterning device and the sensor apparatus are positioned in the first relative configuration; and determine, from the first measurement and the second measurement, aberrations caused by the projection system.

16. A lithographic apparatus comprising:

a measurement system comprising:

a patterning device comprising a plurality of patterned regions, wherein each patterned region is configured to pattern a measurement beam when illuminated with radiation;

an illumination system arranged to illuminate the patterning device with the radiation;

a sensor apparatus comprising a plurality of detector regions, wherein the sensor apparatus is configured to measure the radiation at the detector regions;

a projection system configured to project the measurement beams onto the sensor apparatus;

a positioning apparatus configured to move at least one of the patterning device and the sensor apparatus in a first direction so as to change a relative configuration of the patterning device and the sensor apparatus between a first relative configuration and a second relative configuration; and a controller configured to:

receive a first measurement of the radiation at the detector regions of the sensor apparatus when the patterning device and the sensor apparatus are positioned in the first relative configuration in which at least some of the plurality of detector regions each receive at least one of the measurement beams;

receive a second measurement of the radiation at the detector regions of the sensor apparatus when the patterning device and the sensor apparatus are positioned in the second relative configuration in which each of the at least some of the plurality of detector regions receive a different measurement beam to the measurement beam which is received at the respective one of the at least some of the plurality of detector regions when the patterning device and the sensor apparatus are positioned in the first relative configuration; and determine from the first measurement and the second measurement, aberrations caused by the projection system.

\* \* \* \* \*

UNITED STATES PATENT AND TRADEMARK OFFICE
CERTIFICATE OF CORRECTION

PATENT NO. : 10,620,548 B2
APPLICATION NO. : 15/567191
DATED : April 14, 2020
INVENTOR(S) : Baselmans et al.

Page 1 of 1

It is certified that error appears in the above-identified patent and that said Letters Patent is hereby corrected as shown below:

In the Claims

Column 47, Line 15 Claim 9, replace "remains the same throughout the movement" with --remain the same throughout the movement--.

Column 47, Lines 48-49 Claim 13, replace "wherein the first, second and third directions" with --wherein the first, second, and third directions--.

Signed and Sealed this
Second Day of June, 2020

Andrei Iancu
*Director of the United States Patent and Trademark Office*